US010361104B2

United States Patent
Assaf et al.

(10) Patent No.: US 10,361,104 B2
(45) Date of Patent: Jul. 23, 2019

(54) AMBIENT CONTROLLED TRANSFER MODULE AND PROCESS SYSTEM

(71) Applicant: Applied Materials, Inc., Santa Clara, CA (US)

(72) Inventors: Shay Assaf, Gilroy, CA (US); Andrew Constant, Cupertino, CA (US); Jacob Newman, Palo Alto, CA (US); Charles Carlson, Cedar Park, TX (US); William Tyler Weaver, Austin, TX (US); Stephen Hickerson, Hollister, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/660,784

(22) Filed: Jul. 26, 2017

(65) Prior Publication Data

US 2018/0254207 A1  Sep. 6, 2018

Related U.S. Application Data

(60) Provisional application No. 62/466,527, filed on Mar. 3, 2017, provisional application No. 62/466,533, filed
(Continued)

(51) Int. Cl.
*H01L 21/67* (2006.01)
(52) U.S. Cl.
CPC .. *H01L 21/67196* (2013.01); *H01L 21/67109* (2013.01); *H01L 21/67161* (2013.01);
(Continued)

(58) Field of Classification Search
CPC ......... H01L 21/67196; H01L 21/67207; H01L 21/67201; H01L 21/67184
See application file for complete search history.

(56) References Cited

U.S. PATENT DOCUMENTS 5,303,671 A * 4/1994 Kondo ................ C23C 16/0227
118/719
6,841,006 B2   1/2005 Barnes et al.
(Continued)

FOREIGN PATENT DOCUMENTS

TW       M561909 U    6/2018

OTHER PUBLICATIONS

Chinese Office Action for Application No. 201820553227.2 dated Oct. 18, 2018.
(Continued)

*Primary Examiner* — Kaitlin S Joerger
(74) *Attorney, Agent, or Firm* — Patterson + Sheridan LLP

(57) ABSTRACT

Methods and apparatus for processing a substrate are provided herein. In one implementation, the apparatus includes a load lock chamber coupled to a transfer chamber. The transfer chamber is coupled to a thermal process chamber and a substrate is transferred between each of the load lock chamber, the transfer chamber, and the thermal process chamber. In other implementations, a process platform having a load lock chamber, a transfer chamber, and a thermal process chamber is disclosed. Methods of measuring oxygen concentration in a load lock chamber via evacuation of a transfer chamber are also described herein.

13 Claims, 9 Drawing Sheets

Related U.S. Application Data on Mar. 3, 2017, provisional application No. 62/466,535, filed on Mar. 3, 2017, provisional application No. 62/466,539, filed on Mar. 3, 2017.

(52) U.S. Cl.
CPC .. *H01L 21/67184* (2013.01); *H01L 21/67201* (2013.01); *H01L 21/67207* (2013.01)

(56) References Cited

U.S. PATENT DOCUMENTS

| | | | |
|---|---|---|---|
| 7,159,599 B2* | 1/2007 | Verhaverbeke | H01L 21/67069 134/109 |
| 7,223,323 B2* | 5/2007 | Yang | A23D 7/00 134/148 |
| 8,231,322 B2* | 7/2012 | Talmer | H01L 21/67201 414/217 |
| 8,562,271 B2* | 10/2013 | Hofmeister | H01L 21/6719 414/217 |
| 9,401,294 B2* | 7/2016 | Hofmeister | H01L 21/6719 |
| 9,859,140 B2* | 1/2018 | Talmer | H01L 21/67201 |
| 10,103,043 B2* | 10/2018 | Choi | B01D 46/0045 |
| 10,159,169 B2* | 12/2018 | Vincent | H05K 7/1401 |
| 2001/0041121 A1* | 11/2001 | Grunes | H01L 21/67196 414/217 |
| 2003/0113188 A1* | 6/2003 | Pool | H01L 21/67201 414/217 |
| 2003/0131458 A1* | 7/2003 | Wang | H01L 21/67167 29/25.01 |
| 2004/0166697 A1 | 8/2004 | Wang et al. | |
| 2007/0107845 A1 | 5/2007 | Ishizawa et al. | |
| 2007/0196011 A1* | 8/2007 | Cox | G01N 21/33 382/145 |
| 2011/0245957 A1* | 10/2011 | Porthouse | H01L 21/67109 700/114 |
| 2014/0271097 A1* | 9/2014 | Wang | H01L 21/6708 414/805 |
| 2015/0221534 A1* | 8/2015 | van der Meulen | B25J 9/042 414/225.01 |
| 2015/0376792 A1 | 12/2015 | Spurlin et al. | |
| 2016/0027673 A1* | 1/2016 | Wang | H01L 21/6708 156/345.24 |
| 2016/0169766 A1* | 6/2016 | Ishibashi | G01N 33/0036 73/40 |
| 2016/0240410 A1* | 8/2016 | Reuter | H01L 21/6719 |
| 2016/0314997 A1* | 10/2016 | Reuter | H01L 21/67201 |
| 2017/0092511 A1* | 3/2017 | Basu | H01J 37/32009 |
| 2017/0148654 A1* | 5/2017 | Paul | G05B 19/041 |
| 2017/0229315 A1* | 8/2017 | Zhang | H01L 21/3105 |
| 2017/0253968 A1* | 9/2017 | Yahata | H01L 21/67167 |
| 2017/0271180 A1* | 9/2017 | Lill | H01L 21/67207 |
| 2017/0290166 A1* | 10/2017 | Rice | H01L 21/67196 |
| 2018/0141762 A1* | 5/2018 | Caveney | H01L 21/67173 |
| 2018/0226306 A1* | 8/2018 | Suzuki | H01L 21/67109 |

OTHER PUBLICATIONS

Official Letter from Taiwan Intellectual Property Office (TIPO) regarding Taiwan Application No. 106125236 dated Feb. 23, 2019 (received Mar. 15, 2019).

* cited by examiner

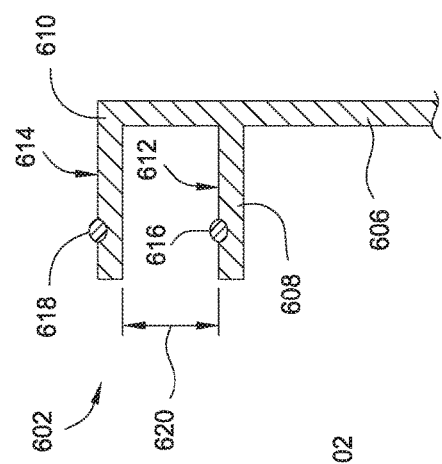
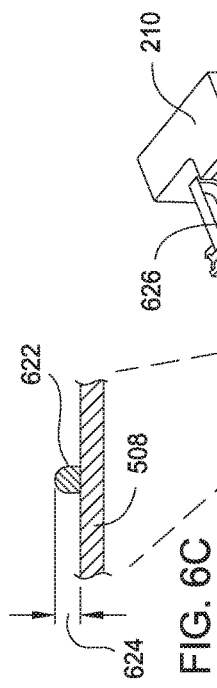
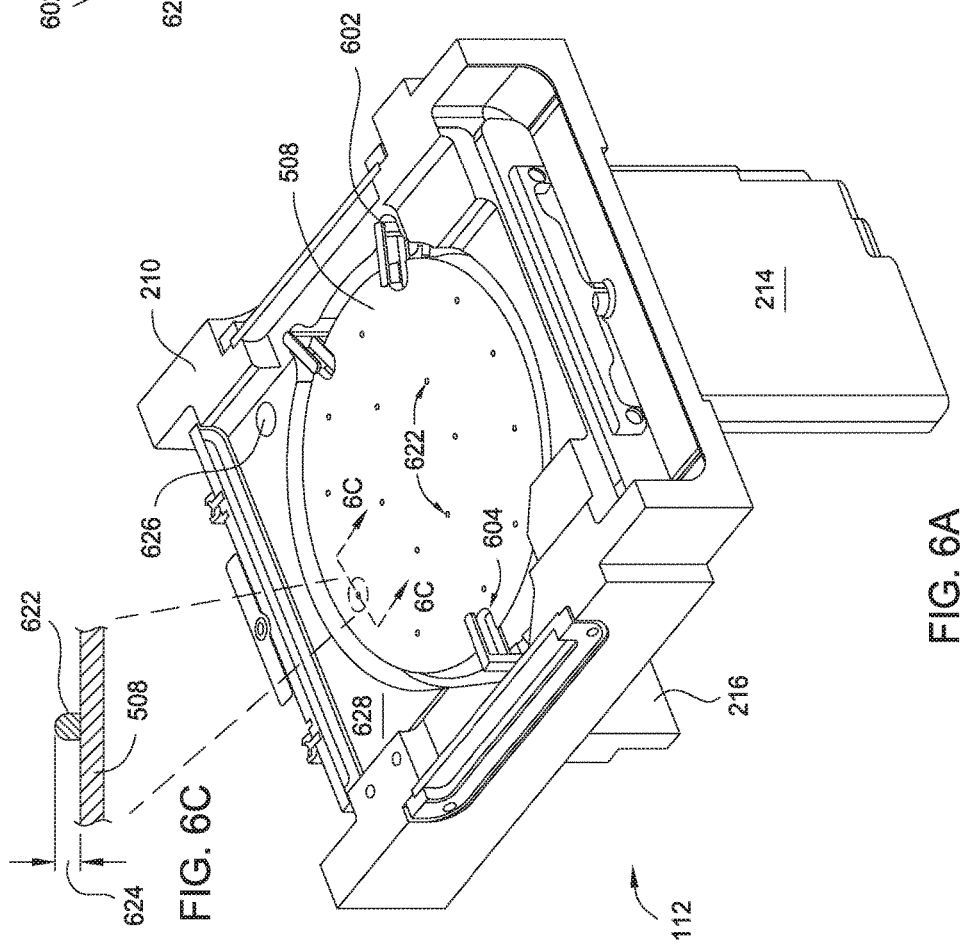

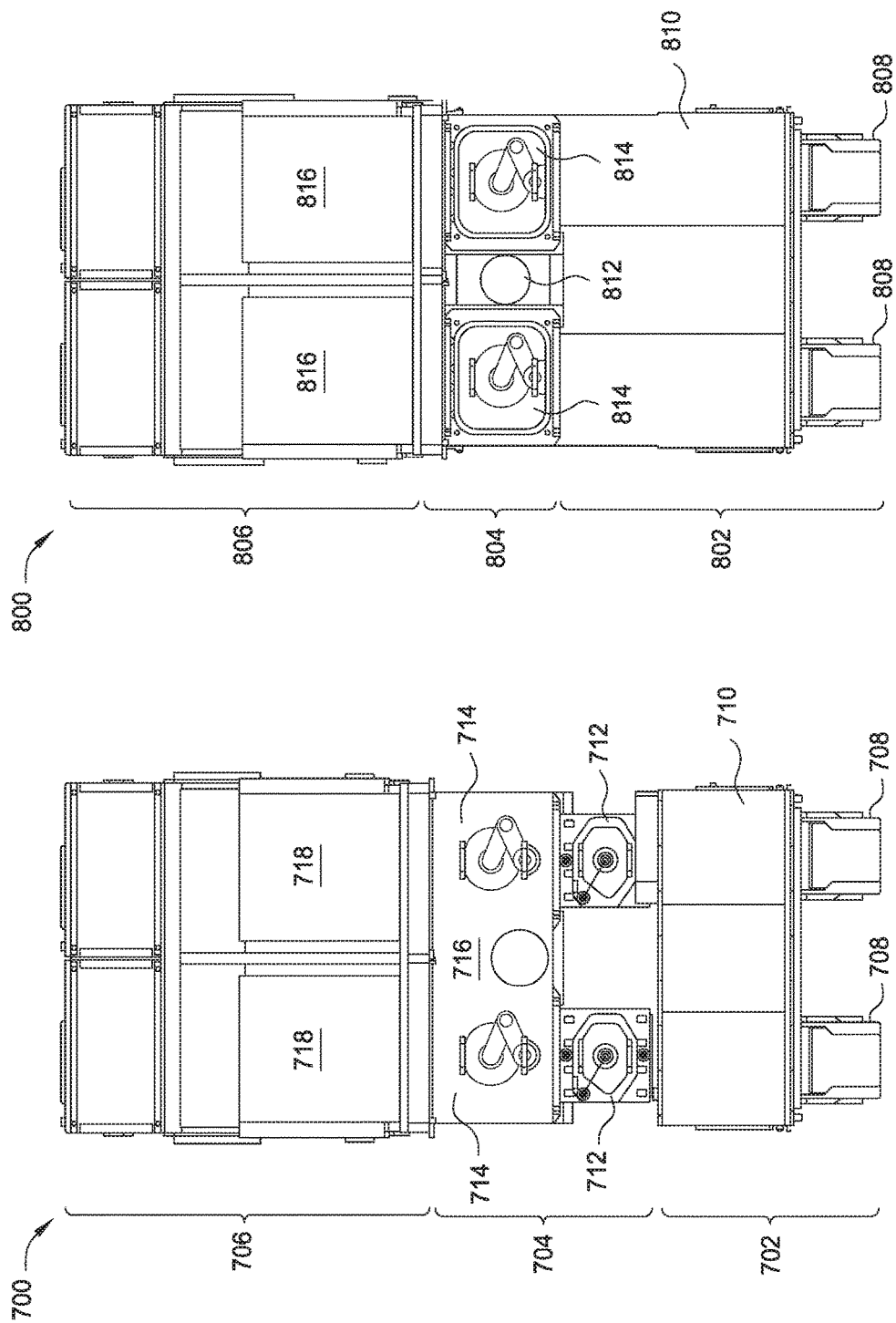

AMBIENT CONTROLLED TRANSFER MODULE AND PROCESS SYSTEM

CROSS-REFERENCE TO RELATED APPLICATIONS

This application claims benefit of U.S. Provisional Patent Applications, Ser. Nos. 62/466,527; 62/466,533; 62/466,535; and 62/466,539 all filed Mar. 3, 2017, and each is incorporated herein by reference in its entirety.

BACKGROUND

Field

Implementations of the present disclosure generally relate to a substrate process and transfer apparatus. More specifically, implementations described herein relate to an ambient controlled transfer module and process system.

Description of the Related Art

Reliably producing sub-half micron and smaller features is one of the key technology challenges for next generation very large scale integration (VLSI) and ultra large scale integration (ULSI) of semiconductor devices. However, as the limits of circuit technology are pushed, the shrinking dimensions of VLSI and ULSI technology have placed additional demands on processing capabilities.

In advanced node devices, metals and barrier layer materials are often utilized in contact integration schemes. However, oxidation of various materials, such as metal and dielectrics, utilized in the contact integration schemes can lead to adhesion issues and de-wetting of contact structure materials. Oxidation of the various materials may also increase contact resistance. As a result, poor adhesion of the contact structure and increased contact resistance may result in poor device performance of device failure.

Accordingly, what is needed in the art are improved apparatus and methods for preventing oxidation of device structures during various stages of device fabrication.

SUMMARY

In one implementation, a substrate processing apparatus includes a factory interface, a substrate transfer module for generating a substantially inert environment at about atmospheric pressure. The substrate transfer module includes a load lock chamber coupled to the factory interface, the load lock chamber having a chamber body defining a process volume and a purge gas port in fluid communication with the process volume and a transfer chamber coupled to the load lock chamber. A process module is also coupled to the substrate transfer module, wherein the process module comprises a plurality of process chamber.

In another implementation, a substrate processing apparatus includes a factory interface and the factory interface comprises a first transfer chamber having a first robot disposed therein. The apparatus also includes a substrate transfer module for generating a substantially inert environment at about atmospheric pressure. The substrate transfer module comprises a load lock chamber coupled to the first transfer chamber and a second transfer chamber having a second robot disposed therein, wherein second transfer chamber is coupled to the load lock chamber. The apparatus also includes a process module coupled to the substrate transfer module, wherein the process module comprises a process chamber and the process chamber is coupled to the second transfer chamber.

In another implementation, a substrate processing apparatus includes a factory interface and the factory interface includes a first transfer chamber having a first robot disposed therein and a plurality of front opening unified pods coupled to the first transfer chamber. The apparatus also includes a substrate transfer module for generating a substantially inert environment at about atmospheric pressure. The substrate transfer module includes an atmospheric load lock chamber coupled to the first transfer chamber and a second transfer chamber having a second robot disposed therein, wherein the second transfer chamber is coupled to the load lock chamber. The apparatus also includes a process module coupled to the substrate transfer module, wherein the process module comprises a laser thermal process chamber and the laser thermal process chamber is coupled to the second transfer chamber.

In another implementation, a substrate transfer apparatus comprises a load lock chamber for generating a substantially inert environment at about atmospheric pressure. The load lock chamber comprises a chamber body defining a process volume, a pedestal disposed in the process volume, a lid coupled to the chamber body opposite the pedestal, a purge gas port disposed through the lid, and an exhaust port disposed in the chamber body adjacent to the pedestal and opposite the purge gas port. The apparatus also includes a transfer chamber for generating a substantially inert environment at about atmospheric pressure coupled to the load lock chamber. The transfer chamber comprises a chamber body defining a transfer volume, a robot disposed in the transfer volume, a plurality of purge gas ports disposed in the chamber body, and an exhaust port disposed in the chamber body opposite the plurality of purge gas ports.

In another implementation, a substrate processing apparatus comprises a load lock chamber for generating a substantially inert environment at about atmospheric pressure. The load lock chamber comprises a chamber body defining a process volume a pedestal disposed in the process volume, a fluid conduit disposed within the pedestal, a plurality of recesses formed along a circumference of the pedestal, and a plurality of lift pins disposed in the process volume, each lift pin disposed adjacent to one or more of the plurality recesses. The apparatus also includes a lid coupled to the chamber body opposite the pedestal, a diffuser plate coupled to the lid at a center region of the lid, wherein a portion of a bottom surface of the lid is tapered extending radially outward from the diffuser plate, a purge gas port disposed through the diffuser plate, and an exhaust port disposed in the chamber body adjacent to the pedestal and opposite the purge gas port.

In another implementation, a substrate transfer apparatus comprises a transfer chamber for generating a substantially inert environment at about atmospheric pressure coupled to the load lock chamber. The transfer chamber comprises a chamber body defining a transfer volume, an optically transparent lid coupled to the chamber body, and a robot disposed in the transfer volume, wherein a blade of the robot is manufactured from quartz. The apparatus also includes a plurality of purge gas ports disposed in the chamber body, a plurality of diffusers extending from the purge gas ports, an exhaust port disposed in the chamber body opposite the plurality of purge gas ports, an exhaust conduit coupled to the exhaust port, and an oxygen sensor in fluid communication with the transfer volume via the exhaust conduit and the exhaust port.

In another implementation, a platform apparatus comprises a first factory interface, a second factory interface coupled to the first factory interface, and a tunnel chamber disposed between the first factory interface and the second factory interface, wherein the tunnel chamber comprises a transfer chamber and a plurality of load lock chamber. The apparatus also includes a first transfer module coupled to the first factory interface, a process module coupled to the first transfer module, a central transfer chamber coupled to the second factory interface, and a plurality of process chambers coupled to the central transfer chamber, wherein at least one of the plurality of process chambers is coupled to the central transfer chamber by a second transfer module.

In one implementation, a platform apparatus comprises a first factory interface, a transfer module coupled to the first factory interface, a process module coupled to the transfer module, a second factory interface, and a central transfer chamber coupled to the second factory interface. The apparatus also includes a tunnel chamber disposed between the first factory interface and the central transfer chamber, wherein the tunnel chamber comprises a transfer chamber and a plurality of load lock chambers. The apparatus also includes a plurality of process chamber coupled to the central transfer chamber.

In one implementation, a substrate process method comprises transferring a substrate from a first chamber to a second chamber, isolating an environment of the second chamber from an environment of the first chamber, removing oxidants from the environment of the second chamber, and cooling the substrate in the second chamber. The method also includes opening a slit valve between the first chamber and the second chamber, evacuating the environment of the first chamber, and analyzing the first chamber exhaust to determine an oxygen concentration of the environment of the second chamber.

In one implementation, a substrate process method comprises transferring a substrate from a transfer chamber to a load lock chamber, closing a slit valve between the transfer chamber and the load lock chamber to isolate an environment of the load lock chamber from an environment of the transfer chamber, removing oxidants from the environment of the load lock chamber, and cooling the substrate in the load lock chamber. The method also includes opening the slit valve between the transfer chamber and the load lock chamber, evacuating the environment of the transfer chamber during opening of the slit valve, and analyzing the transfer chamber exhaust to determine an oxygen concentration of the environment of the load lock chamber during the cooling of the substrate.

In one implementation, a substrate transfer method comprises transferring a substrate from a process chamber to a transfer chamber, transferring the substrate from the transfer chamber to a load lock chamber, and closing a slit valve between the transfer chamber and the load lock chamber to isolate an environment of the load lock chamber from an environment of the transfer chamber. The method also includes removing oxidants from the environment of the load lock chamber, cooling the substrate in the load lock chamber, opening the slit valve between the transfer chamber and the load lock chamber, evacuating the environment of the transfer chamber during opening of the slit valve, and analyzing the transfer chamber exhaust to determine an oxygen concentration of the environment of the load lock chamber during cooling of the substrate.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, may admit to other equally effective implementations.

FIG. 6A illustrates a schematic, partial perspective view of the load lock chamber of FIG. 5 according to implementations described herein.

FIG. 6B illustrates a schematic, cross-sectional view of a lift pin of the load lock chamber of FIG. 6A according to implementations described herein.

FIG. 6C illustrates a schematic, cross-sectional view of a substrate support feature of the load lock chamber of FIG. 6A according to implementations described herein.

FIG. 7 illustrates a schematic, plan view of a process system according to implementations described herein.

FIG. 8 illustrates a schematic, plan view of a process system according to implementations described herein.

Figure 1:
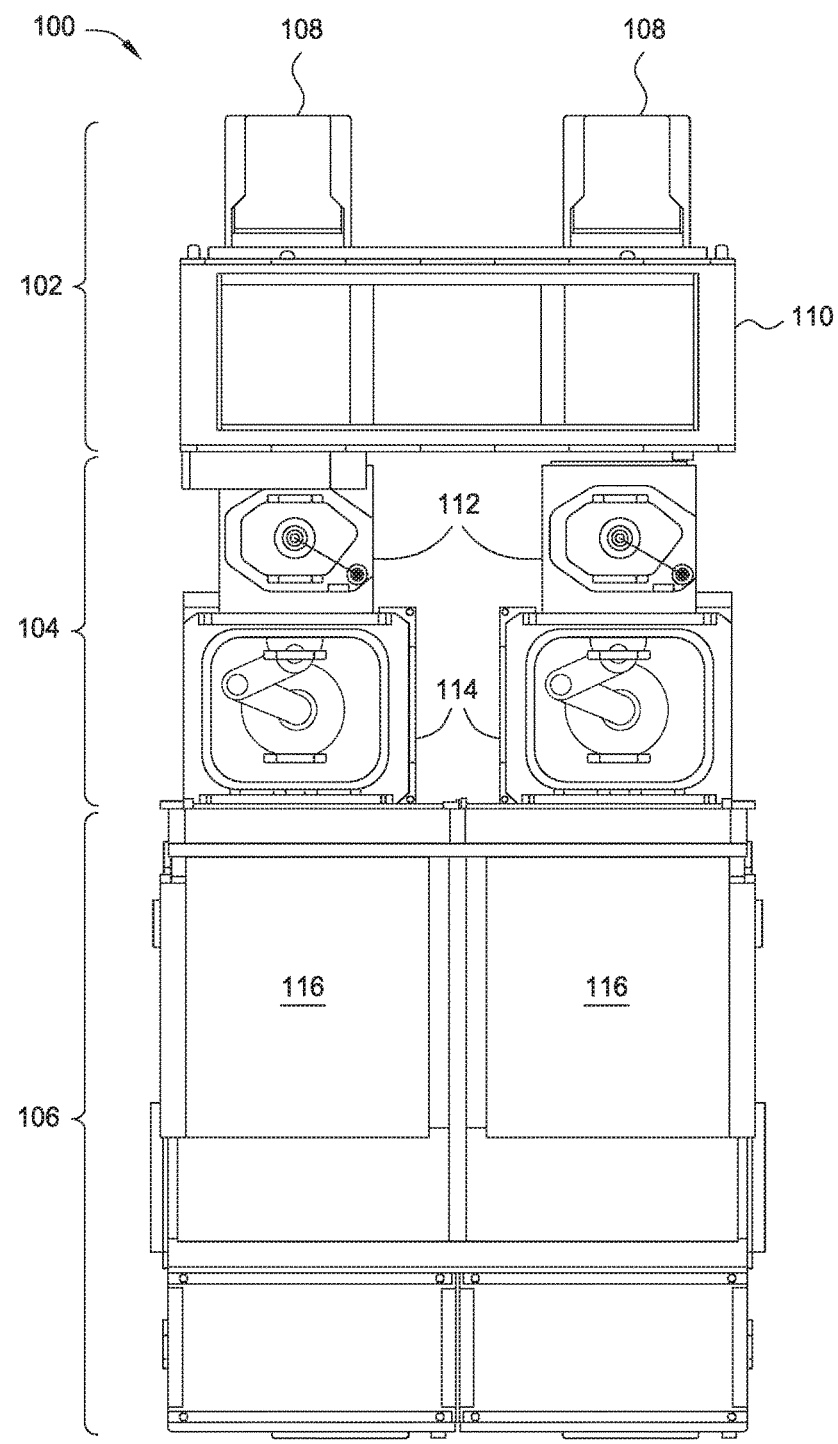
FIG. 1 illustrates a schematic, plan view of a process system according to implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Methods and apparatus for processing a substrate are provided herein. In one implementation, the apparatus includes an ambient controlled load lock chamber coupled to a transfer chamber. The transfer chamber may be coupled to a thermal process chamber, and in such cases a substrate is transferred between each of the load lock chamber, the transfer chamber, and the thermal process chamber. In other implementations, a process platform having an ambient controlled load lock chamber, a transfer chamber, and a thermal process chamber is disclosed. Methods of measuring oxygen concentration in a load lock chamber by analyzing exhaust gas from a transfer chamber are also described herein.

FIG. 1 illustrates a schematic, plan view of a process system 100 according to implementations described herein. The process system 100 includes a factory interface 102, a substrate transfer module 104, and a process module 106. The factory interface 102 includes a factory interface (FI) transfer chamber 110 and the FI transfer chamber is configured to interface with one or more front opening unified pods (FOUPs) 108. In one implementation, the FI transfer chamber 110 has a single robot disposed therein which transfers substrates between the FUOPs 108 and the substrate transfer module 104. In another implementation, the FI transfer chamber 110 has a plurality of robots, for example, two robots, disposed therein. In this implementation, each of the robots transfers substrates from one of the FOUPs 108 to a dedicated portion of the substrate transfer module 104.

The substrate transfer module 104 includes one or more load lock chambers 112 and one or more transfer chambers 114. In the illustrated implementation, the substrate transfer module 104 includes two load lock chambers 112 and two transfer chambers 114, however, it is contemplated that a greater or lesser number of load lock chamber 112 and transfer chamber 114 pairs may be utilized in the process system 100.

Each load lock chamber 112 is coupled to the FI transfer chamber 110 on a first side of the load lock chamber 112 and each transfer chamber 114 is coupled to a respective load lock chamber 112 on a second side of the load lock chamber 112 opposite the first side of the load lock chamber 112. A first side of each transfer chamber 114 is coupled to the respective load lock chamber 112. The transfer chamber 114 has a robot disposed therein and the transfer chamber 114 is in operable communication with the load lock chamber 112. For example, a substrate may be transferred between the transfer chamber 114 and the load lock chamber 112

The process module 106 includes one or more process chambers 116, each of which is coupled to a respective transfer chamber 114 at a second side of the transfer chamber 114 opposite the first side of the transfer chamber 114. In the illustrated implementation, the process module 106 includes two process chambers 116, however, it is contemplated that a greater number of process chambers may be utilized in the process module 106. It should be noted that the various chambers may be coupled in a configuration that is not linearly aligned as shown in FIG. 1. Thus, the various couplings may be made at locations and sides of the chambers that are not necessarily opposite.

In one implementation, the process chamber 116 is a thermal processing chamber, for example, a rapid thermal processing chamber. In certain implementations, the process chamber 116 is a laser thermal process chamber. One example of a laser thermal process chamber is the ASTRA™ thermal processing tool available from Applied Materials, Inc., Santa Clara, Calif. In alternative implementations, the process chamber 116 is a lamp based thermal process chamber. Examples of a lamp based thermal process chamber include the RADIANCE®, RADIANCE® PLUS, and VULCAN™ rapid thermal processing tools, all of which are available from Applied Materials, Inc., Santa Clara, Calif. It is also contemplated that other tools from other manufacturers may be advantageously implemented according to the implementations described herein. In addition to the implementations described above, it is contemplated that the process chamber 116 may also be an etch chamber, a deposition chamber, or a cleaning chamber, depending upon the desired implementation.

In operation, a substrate to be processed is delivered to the factory interface 102 via the FOUPs 108. A robot in the FI transfer chamber 110 removes the substrate from the FOUP 108 and transfers the substrate to the load lock chamber 112. A robot disposed in the transfer chamber 114 retrieves the substrate from the load lock chamber 112 and transfers the substrate to the process chamber 116 where the substrate is processed. After processing, the robot in the transfer chamber 114 retrieves the substrate from the process chamber 116 and transfers the substrate to the load lock chamber 112. The robot in the FI transfer chamber 110 then retrieves the substrate from the load lock chamber 112 and returns the substrate to the FOUP 108.

In implementations where the process chamber 116 is a thermal processing chamber, the substrate may be cooled in the load lock chamber 112 prior to transfer to the factory interface 102. The various chambers are isolated, one from the other, at appropriate times by use of sealing doors (not shown) between the chambers, which are opened at appropriate times for passage of substrates between the chambers.

Figure 2:
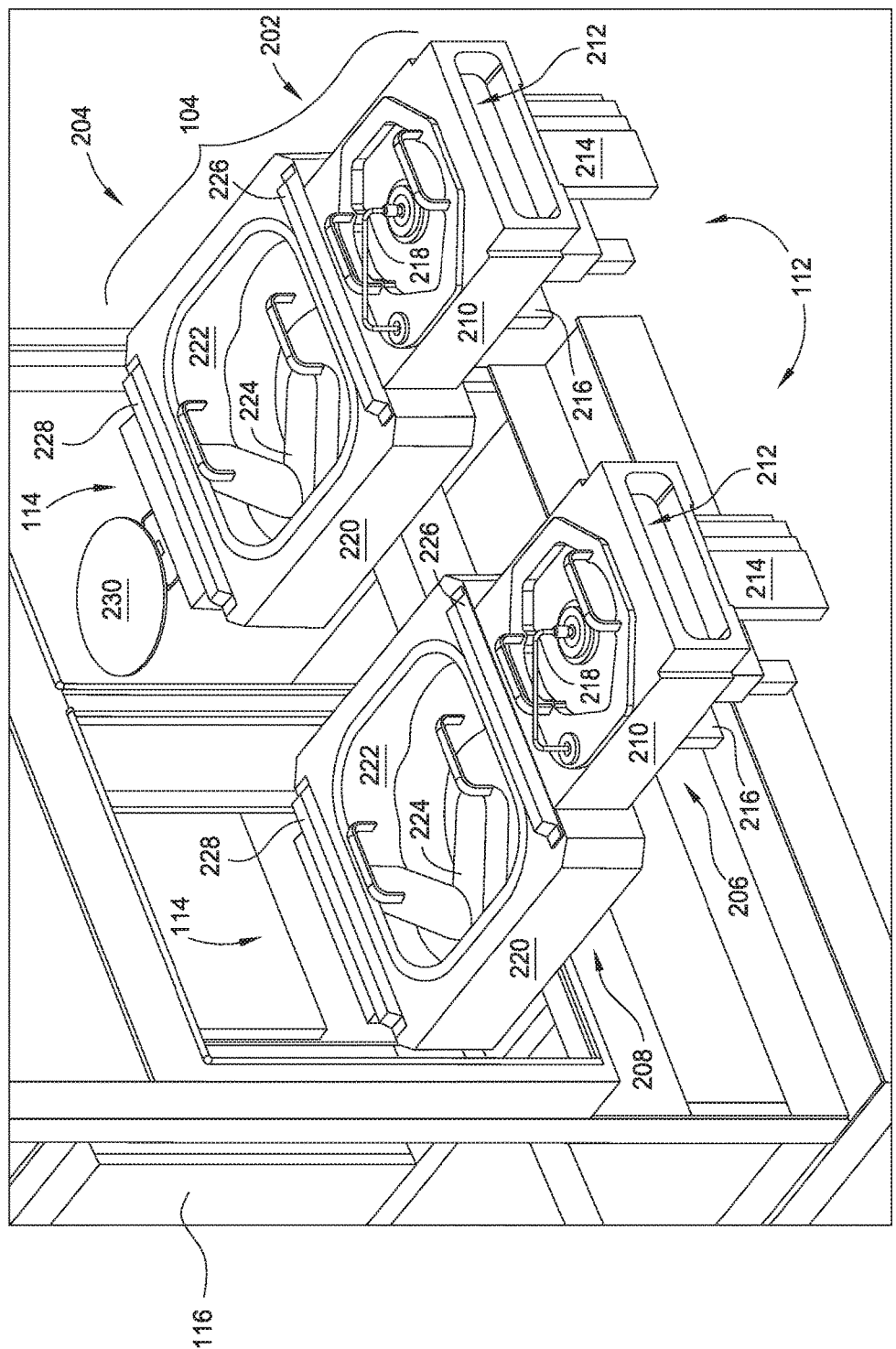
FIG. 2 illustrates a schematic, perspective view of a substrate transfer module according to implementations described herein.

FIG. 2 illustrates a schematic, perspective view of the substrate transfer module 104 according to implementations described herein. The illustrated substrate transfer module 104 includes a first load lock chamber 202 which is coupled to a first transfer chamber 204 and a second load lock chamber 206 which is coupled to a second transfer chamber 208. The first load lock chamber 202 and first transfer chamber 204 define one of the substrate transfer modules 104, and the second load lock chamber 206 and second transfer chamber 208 define another one of the substrate transfer modules 104. Thus, the illustrated implementation shows a pair of substrate transfer modules 104. The first and second load lock chambers 202, 206 and the first and second transfer chambers 204, 208 are similar to the load lock chamber 112 and transfer chamber 114, respectively, described with regard to FIG. 1.

The load lock chambers 112 include a chamber body 210 which defines a process volume (not shown) which is sized to accommodate a substrate therein. The chamber body 210 may be sized to accommodate substrates having varying diameters, such as a 200 mm diameter, a 300 mm diameter, or a 450 mm diameter, among other sizes. The chamber body 210 is formed from a metallic material, such as aluminum, stainless steel, and combinations thereof. In one implementation, the chamber body 210 is machined from aluminum billet.

A first slit valve 212 formed in the body 210 is sized to accommodate passage of a substrate therethrough. The first slit valve 212 is configured to mate with the factory interface 102 (FIG. 1) and a first slit valve door 214 is coupled to the body 210 adjacent to the first slit valve 212. In operation, the first slit valve door 214 opens and closes the first slit valve 212 to enable access to the load lock chamber 112 by the robot disposed in the factory interface 102. The load lock chamber 112 also includes a second slit valve (not shown) which is disposed in the chamber body 210 opposite the first slit valve 212. A second slit valve door 216 is coupled to the body 210 adjacent to the second slit valve to open and close the second slit valve. The second slit valve (described in greater detail with regard to FIG. 5) is disposed adjacent to the transfer chamber 114. A purge gas conduit 218 is also coupled to the chamber body 210 and is in fluid communication with the process volume.

The transfer chamber 114, which is coupled directly to the load lock chamber 112 in the implementation of FIG. 2, includes a chamber body 220, a robot 224 disposed within the chamber body 220, and a lid 222. The chamber body 220 is formed from a metallic material, such as aluminum, stainless steel, and combinations thereof. In certain implementations, similar to the load lock chamber 112, the chamber body 220 is fabricated from aluminum billet. The robot 224 is configured to transfer substrates, such as the illustrated substrate 230, between the load lock chamber 112 and the process chamber 116. As a result, the reach of the robot is sufficient to extend into the load lock chamber 112 and the process chamber 116 to position and retrieve substrates for transfer operations.

The lid 222 removably coupled to a top of the chamber body 220. In one implementation, the lid 222 is formed from an optically transparent or predominantly optically transparent material to enable viewing inside the transfer chamber 114. In one implementation, the lid 222 is formed from a polymeric material, such a polycarbonate or the like. Although not illustrated, a plurality of apertures are formed in the body 220 of the transfer chamber 114 to enable passage of the substrate 230 therethrough. A plurality of local center finding (LCF) sensors 226, 228 are also coupled to the chamber body 220. The LCF sensors are optically coupled with the apertures to view substrates passing into and out of the transfer chamber 114.

A first LCF sensor 226 is coupled to the chamber body 220 adjacent the load lock chamber 112 and is configured to detect a position of the substrate 230 as the substrate 230 travels from the load lock chamber 112 to the transfer chamber 114. A second LCF sensor 228 is coupled to the chamber body 220 opposite the first LCF sensor 226 and adjacent to the process chamber 116. Similar to the first LCF sensor 226, the second LCF sensor is configured to detect a position of the substrate 230 as the substrate 230 travels from the transfer chamber 114 to the process chamber 116. Each of the LCF sensors 226, 228 also detect the position of the substrate during transfer from the transfer chamber 114 to the load lock chamber 112 and from the process chamber 116 to the transfer chamber 114, respectively.

Figure 3:
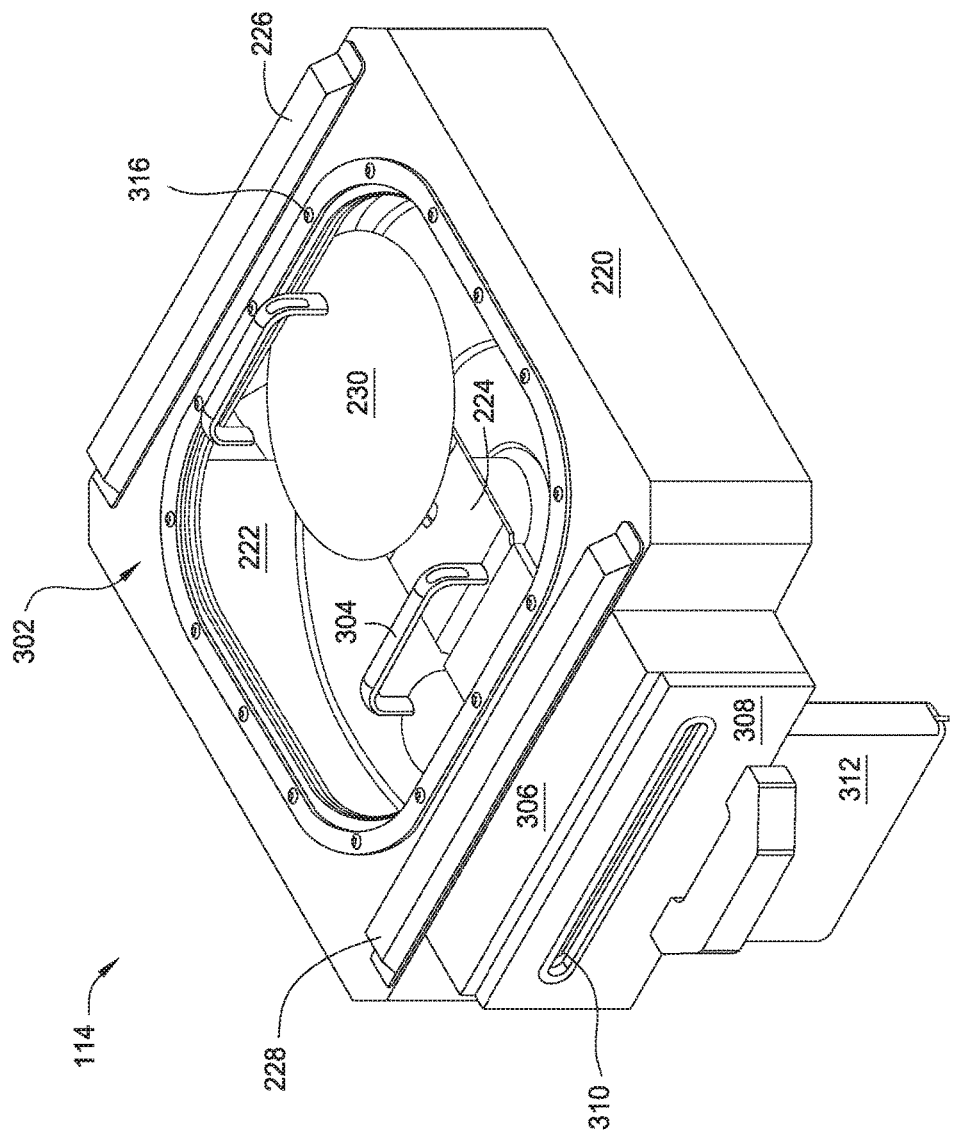
FIG. 3 illustrates a schematic, perspective view of a transfer chamber according to implementations described herein.

FIG. 3 illustrates a schematic, perspective view of the transfer chamber 114 according to implementations described herein. The chamber body 220 includes a top surface 302 which supports the LCF sensors 226, 228 and the lid 222. The lid 222 has a plurality of handles 304 attached thereto to enable efficient removal of the lid 222 from the chamber body 220. By utilizing an optically transparent material for the lid 222, it is contemplated that other view ports formed in the chamber body 220 are unnecessary, thereby simplifying the chamber body manufacturing process. Moreover, the lid 222, which may be coupled to the chamber body 220 by threaded fasteners or the like, is easily removable should maintenance be performed, thereby reducing down time and improving operating efficiency. The lid 222 may be coupled to the chamber body 220 by a suitable fastening and sealing system. In one implementation, the lid 222 may be fastened to the chamber body 220 by a plurality of screws 316, which may be unscrewed to unfasten the lid 222. A seal member (not shown) may be disposed between the lid 222 and the chamber body 220 to provide vacuum seal when the transfer chamber 114 is at operating pressure.

A process chamber port adapter 306 is coupled to the chamber body 220 on a surface of the chamber body 220 which couples to the process chamber 116 (not shown). In one implementation, the port adapter 306 is coupled to the chamber body 220 by a plurality of fasteners, such as bolts or the like. A mounting plate 308 is coupled to the port adapter 306 to enable secure coupling of the transfer chamber 114 to the process chamber 116. The mounting plate 308 is removably coupled to the port adapter 306 and may be replaced with a different adapter plate should it be desirable to utilize the substrate transfer module 104 with different types of process chambers.

A slit valve 310 is an opening that is formed in, and extends through, each of the chamber body 220, the port adapter 306, and the mounting plate 308. Similar to other slit valves described herein, the slit valve 310 is sized to accommodate passage of the substrate 230 therethrough. The slit valve 310 is opened and closed by a slit valve door 312 which is coupled to either the chamber body 220 or the port adapter 306, depending upon the desired implementation.

Figure 4:
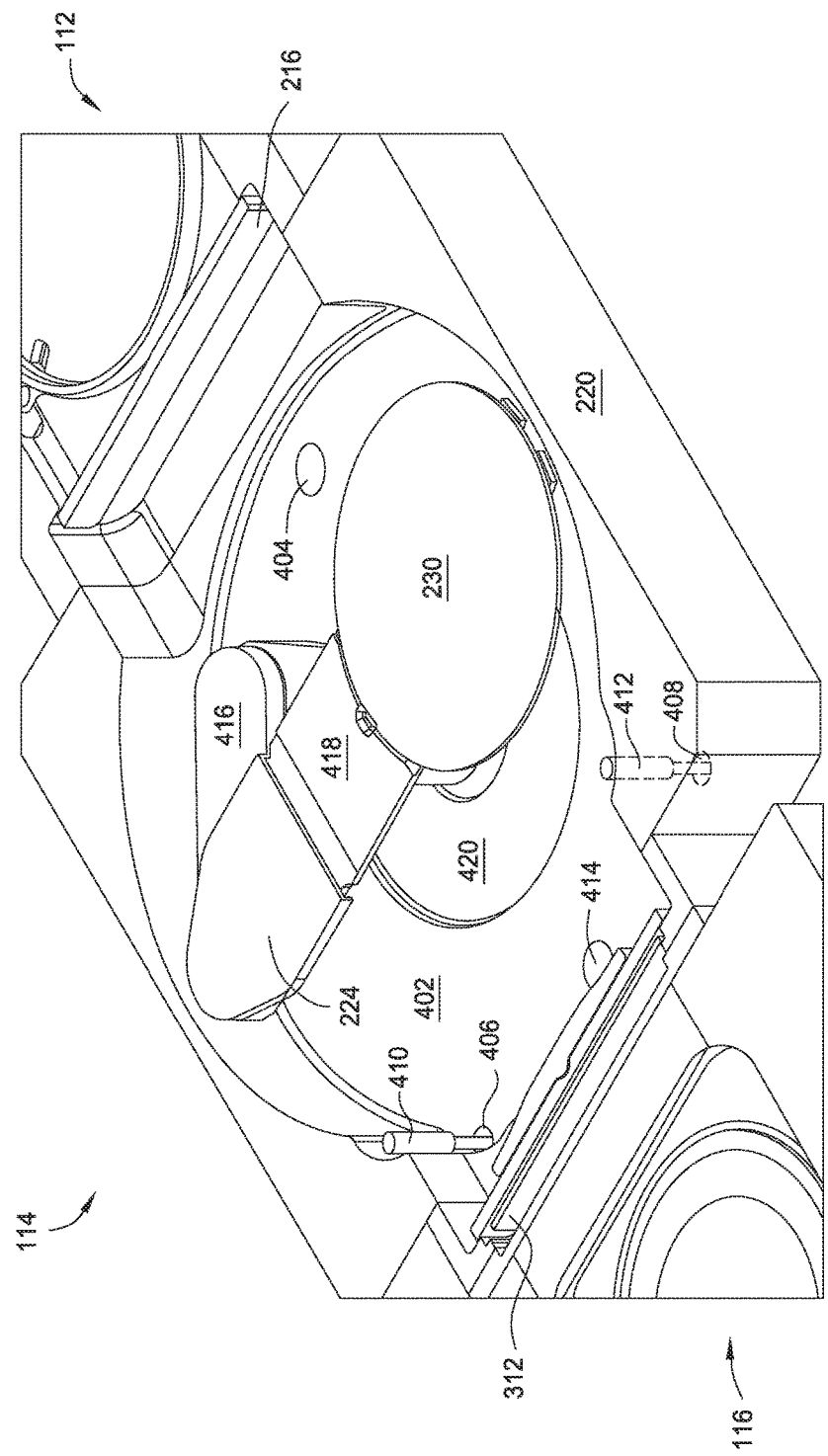
FIG. 4 illustrates a schematic, partial perspective view of the transfer chamber of FIG. 3 according to implementations described herein.

FIG. 4 illustrates a schematic, partial perspective view of the transfer chamber 114 of FIG. 3 according to implementations described herein. The lid 222 has been removed and a portion cut away to more clearly illustrate internal aspects of the transfer chamber 114. The chamber body 220 includes a first base plate 402 and a second base plate 420. In one implementation, the first base plate 402 is part of the chamber body 220. In an alternate implementation, the first base plate 402 is an insert removably coupled to the chamber body 220. The second base plate 420 is also coupled to the chamber body 220. In one implementation, the second base plate 420 is formed from the same material as the first base plate 402 and the chamber body 220. The second base plate 420 may also be an insert fastened to the chamber body 220. The second base plate 420 is annular in shape with an opening through which the robot 224 extends. An actuator (not shown), which may be a rotational actuator or a z-θ actuator, located outside the chamber body 220 couples to the robot 224 through the opening in the second base plate 420. The first base plate 402 is also toroidal in shape and surrounds the second base plate 420.

An exhaust port 404 is formed in the base plate 402 adjacent the second slit valve door 216. The exhaust port 404 may be centered relative to the second slit valve door 216 (i.e. located such that a center of the exhaust port 404 lies on a line bisecting, and perpendicular to, the slit valve door 216) or may be offset from the center of the second slit valve door 216. The exhaust port 404 extends through the base plate and provides fluid communication between a volume of the transfer chamber 114 internal to the chamber body 220 and an exhaust (not shown).

A plurality of purge gas ports 406, 408 are formed in the first base plate 402 adjacent the slit valve door 312. A first purge gas port 406 is disposed in the first base plate 402 azimuthally between about 90° and about 180° from the exhaust port 404 in a first direction. A second purge gas port 408 (shown in phantom) is disposed in the first base plate 402 azimuthally between about 90° and about 180° from the exhaust port 404 in a second direction opposite the first direction. More generally, the purge gas ports 406, 408 are disposed through the first base plate 402 opposite the exhaust port. The azimuthal displacement of the first and second purge gas ports 406 and 408 from the exhaust port 404 may be the same, in opposite directions, or may be different.

An optional exhaust port 414 may be disposed in the first base plate 402 opposite the exhaust port 404. The optional exhaust port 414 may be utilized should it be desirable for a higher volume of fluid flow to be exhausted from the transfer chamber 114. In an alternate implementation, the exhaust port 404 may be disposed in the first base plate 402 at the position of the optional exhaust port 414 and the purge gas ports 406, 408 may be disposed in an orientation similar to that illustrated but adjacent the second slit valve door 216 instead of adjacent the slit valve door 312. In other words, the transfer chamber 114 may have one or two exhaust ports 404 (and 414), which may be located adjacent to the slit valve doors 216, or 312, or both, and the purge gas ports 406 and 408 may be located adjacent to the slit valve doors 216 or 312. It should additionally be noted that the transfer chamber 114 may have one, two, three, or four of the purge gas ports 406, which may be located adjacent to the slit valve doors 216, or 312, or both.

A plurality of diffusers 410, 412 are coupled to the first base plate 402 in the first purge gas port 406 and the second purge gas port 408, respectively. The diffusers 410, 412 extend from the purge gas ports 406, 408 in a plane above the first base plate 402. Each of the purge gas ports 406, 408 are fluidly coupled to a purge gas source (not shown) and the purge gas ports 406, 408 enable introduction of purge gas into the transfer chamber 114. Suitable examples of purge gases include inert gases, such as nitrogen, helium, and argon or the like.

In operation, the transfer chamber 114 may be exhausted from atmospheric pressure to a reduced pressure of between about 2 Torr and about 5 Torr. Subsequently, purge gas may be introduced to the transfer chamber 114. The purge gas travels through the purge gas ports 406, 408 where it is deflected by the diffusers 410, 412 throughout the transfer chamber 114. The purge gas may be delivered through the purge gas ports 406, 408 at a rate of between about 10 standard liters per minute (slm) and about 200 slm, such as between about 50 slm and about 90 slm. It is contemplated that the environment within the transfer chamber 114, when purged according to the implementations described herein, may achieve an oxygen concentration of less than about 0.1 parts per million (ppm)

Generally, the transfer chamber 114 may be maintained at about atmospheric pressure. In one implementation, purge gas may be utilized to remove non-inert or undesirable gases from the transfer chamber 114. In another implementation, purge gases may be utilized to pressurize the transfer chamber 114 to slightly above atmospheric pressure. In this implementation, an environment within the transfer chamber 114 is maintained at a pressure of between about 1 pound per square inch (psi) and about 10 psi, such as about 5 psi above atmospheric pressure. By maintaining the transfer chamber environment at a slightly positive pressure, it is believed that maintenance of an inert and clean environment within the transfer chamber 114 may be achieved by ensuring that any gas leaks in the chamber flow toward the exterior of the chamber, thus preventing intrusion of environmental gases into the chamber. In this way, a substantially inert environment may be achieved. In one implementation, the substantially inert environment is substantially devoid of oxidants, such as oxygen, air, $CO_2$, water vapor, and the like.

The robot 224 rotates about a central axis and has an arm 416 which enables substrate transfer in the X and Y directions. The arm 416 is coupled to a blade 418 which supports the substrate 230 during transfer. The blade 418 may be manufactured from a material such as quartz. By utilizing quartz, the blade is capable of supporting the substrate 230 after processing in the process chamber 116 when the substrate 230 may have a temperature of greater than about 500° C. In one implementation, a portion of the arm 416 which is coupled to the blade 418 may be fabricated from an alloy material, such as Nitronic® 60, to minimize stress on the blade 418 due to thermal expansion.

In addition to the implementations described above, the transfer chamber 114 may be actively cooled to facilitate cooling of the substrate 230 after processing in the process chamber 116. In this implementation, fluid may be flowed through channels formed in the body 220 or by introduction of a cooled purge gas into the transfer chamber 114 via the purge gas ports 406, 408. It is believed that by cooling the transfer chamber 114, the amount of time the substrate 230 is cooled in the load lock chamber 112 post processing may be reduced.

Figure 5:
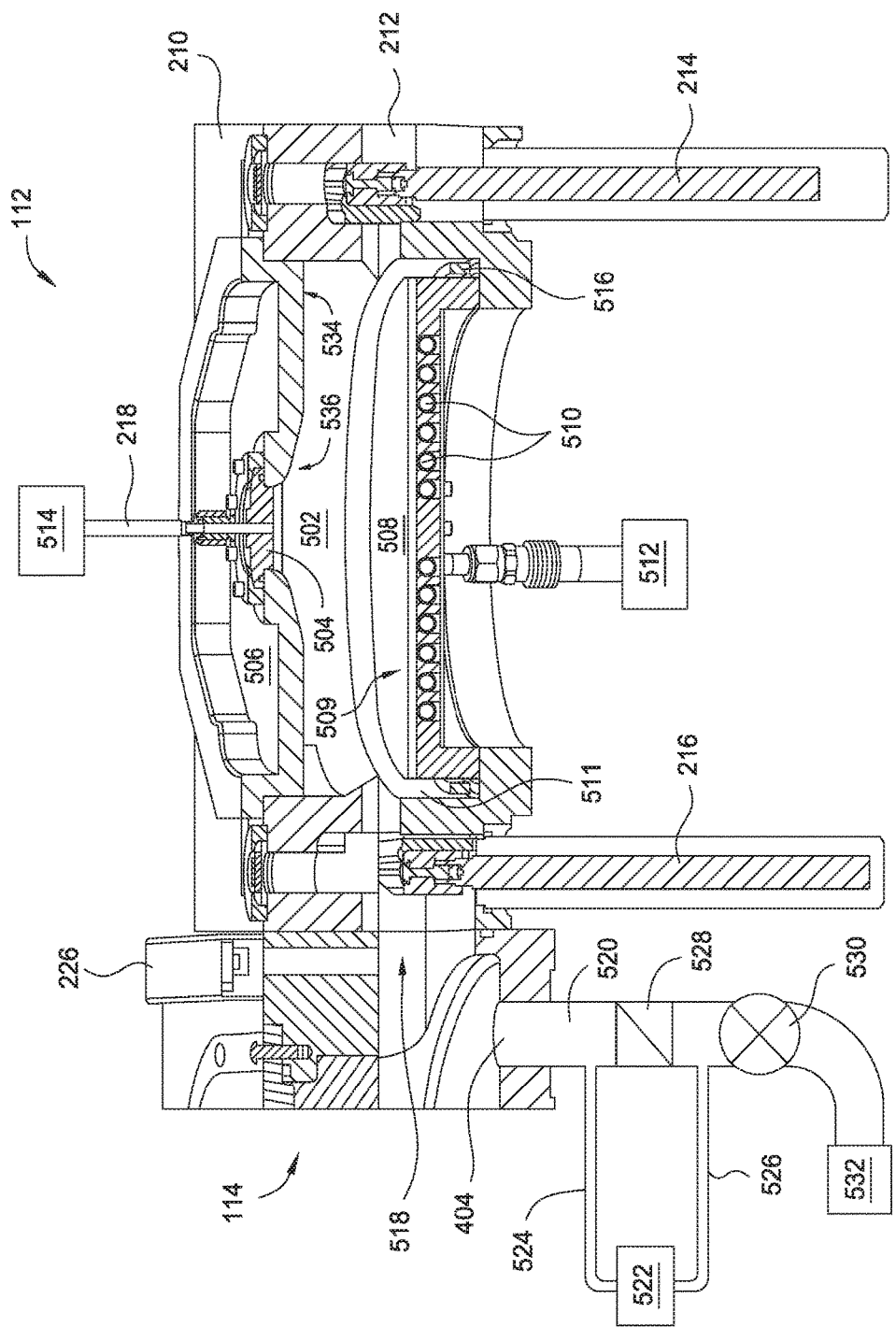
FIG. 5 illustrates a schematic, cross-sectional view of a load lock chamber according to implementations described herein.

FIG. 5 illustrates a schematic, cross-sectional view of the load lock chamber 112 according to implementations described herein. The load lock chamber 112 includes the chamber body 210 which defines an internal volume 502. A substrate support 508 is disposed within the internal volume 502 and a plurality of fluid conduits 510 are disposed within the substrate support 508. The fluid conduits 510 may traverse through the pedestal in a spiral path, a circuitous path, a serpentine path, or other tortured path. The fluid conduits 510 are disposed adjacent to a substrate supporting surface 509 of the substrate support 508 to provide proximity of the fluid conduits 510 to a substrate in contact with the substrate supporting surface 509. Such proximity promotes thermal transfer efficiency between the substrate and a fluid circulating through the fluid conduits 510. In one implementation, a distance between an outer diameter of each fluid conduit 510 and the substrate supporting surface is about 0.1 mm to about 5 mm, for example about 1 mm.

The fluid conduits 510 are also fluidly coupled to a cooling fluid source 512. Suitable cooling fluids include water, water-based ethylene glycol mixtures, a perfluoropolyether (e.g., Galden® fluid), oil-based thermal transfer fluids, liquid metals (such as gallium or gallium alloy) or other similar fluids. In one implementation, the substrate support 508 may be maintained at a temperature of between about 10° C. and about 30° C., such as about 20° C. during cooling of the substrate 230. Optionally, a heater 516 may also be provided in the internal volume 502 should heating of the substrate 230 be desirable. The heater 516 may be a ceramic heater or the like or may be a resistive heater disposed within, or otherwise in thermal contact (for example adjacent to), the substrate support 508. In the implementation of FIG. 5, an optional heater 516 is shown adjacent to the substrate support 508 in a recess 511 surrounding the substrate support 508. The recess 511 is open to the internal volume 502 so that the substrate support 508 has a pedestal shape. Alternately, the substrate support 508 may be a plate that contacts a sidewall 513 of the load lock 112, and the optional heater 516 and recess 511 may be separated from the internal volume 502 by the substrate support 508.

A lid 506 is coupled to the chamber body 210 opposite the substrate support 508. The lid 506 may be fabricated from a metallic material similar to, or the same as, the materials selected for the chamber body 210. A diffuser plate 504 may be coupled to and disposed at a central region of the lid 506. The diffuser plate 504 is in fluid communication with the internal volume 502 and the purge gas conduit 218. The purge gas conduit 218 is coupled to a purge gas source 514 and the purge gas conduit extends through the diffuser plate 504 adjacent the internal volume 502.

A bottom surface 534 of the lid 506 extends radially inward from the chamber body 210 to the diffuser plate 504. A portion 536 of the bottom surface 534 of the lid 506 is tapered extending radially outward from the diffuser plate 504. It is believed that the topography of the lid bottom surface 534, in combination with delivering purge gas through the lid 506 and the diffuser plate 504 provides for improved distribution of purge gas throughout the internal volume 502.

In operation, the load lock chamber 112 is maintained, for a substantial portion of substrate cooling operations, at substantially atmospheric pressure. However, the composition of the environment in the internal volume 502 is controlled to be a substantially inert environment. To ensure a substantially inert environment (i.e. an environment substantially devoid of oxidants or reducers, for example, an $O_2$ concentration less than 1 ppm) the load lock chamber 112 is exhausted from approximately atmospheric pressure to a reduced pressure of between about 2 Torr and about 5 Torr. Subsequently, the internal volume 502 is purged with an inert gas, such as nitrogen, helium, or argon or the like. In one implementation, a flow rate of the purge gas during purging of the internal volume 502 is between about 2 slm and about 100 slm, for example, about 50 slm. As a result of the purging, the pressure is elevated to approximately atmospheric pressure or slightly above atmospheric pressure, such as between about 1 psi and about 10 psi, for example, about 5 psi, above atmospheric pressure.

A second slit valve 518 is disposed in the chamber body 210 opposite the first slit valve 212. The first slit valve 212 and the second slit valve 518 are disposed along the same plane. The second slit valve 518 is disposed adjacent the transfer chamber 114 and is opened and closed by the second slit valve door 216. As previously described, the exhaust port 404 of the transfer chamber 114 is disposed adjacent the second slit valve door 518.

During substrate transfer and substrate cooling in the load lock chamber 112, it is often desirable to maintain the internal volume 502 in an environment having substantially no oxygen. When the second slit valve door 216 is opened, the environment of the load lock internal volume 502 can be detected by analyzing the exhaust of the transfer chamber 114 obtained from the exhaust port 404. Proximity of the exhaust port 404 to the second slit valve door 216 allows gases from the load lock chamber 112 to flow into the exhaust port 404 through the second slit valve 518 when the second slit valve door 216 is open.

The transfer chamber 114 includes an exhaust conduit 520 coupled to and in fluid communication with the exhaust port 404. The exhaust conduit 520 is in fluid communication with an exhaust outlet 532. A pump 530 is coupled to the exhaust conduit 520 between the exhaust outlet 532 and the exhaust port 404 and a check valve 528 is disposed in the exhaust conduit 520 between the pump 530 and the exhaust port 404. During pumping of the transfer chamber 114, gases flow through the exhaust port to the exhaust outlet 532.

An oxygen sensor 522 is in fluid communication with the exhaust conduit 520 via a first conduit 524 and a second conduit 526. The oxygen sensor 522 has a pump disposed therein and can pull exhaust gas from the exhaust conduit 520 for sampling via the first conduit 524. Alternately, the oxygen sensor 522 may rely on differential pressure across the check valve 528 to flow gas through the oxygen sensor 522, thus omitting the need for a separate pump in the oxygen sensor 522. The first conduit 524 is coupled to the exhaust conduit 520 between the exhaust port 404 and the check valve 528. The second conduit 526 extends from the oxygen sensor 522 to the exhaust conduit 520 between the check valve 528 and the pump 530.

In operation, the pump 530 draws gases from the transfer chamber environment, which also contains fluids from the load lock chamber environment when the second slit valve 518 is open, to the exhaust outlet 532. During evacuation of the transfer chamber 114, the oxygen sensor 522 draws a sampling volume of exhaust fluid, analyzes the exhaust for oxygen, and returns the exhaust to the exhaust conduit 520. Suitable examples of the oxygen sensor which may be implemented according to the implementations described herein include the Model 3100 $O_2$ Analyzer, available from Neutronics, Inc., Exton Pa. It is contemplated that other $O_2$ analyzers from other manufacturers capable of detecting an oxygen concentration of less than about 1 ppm may also be utilized according to the implementations described herein.

Figure 11:
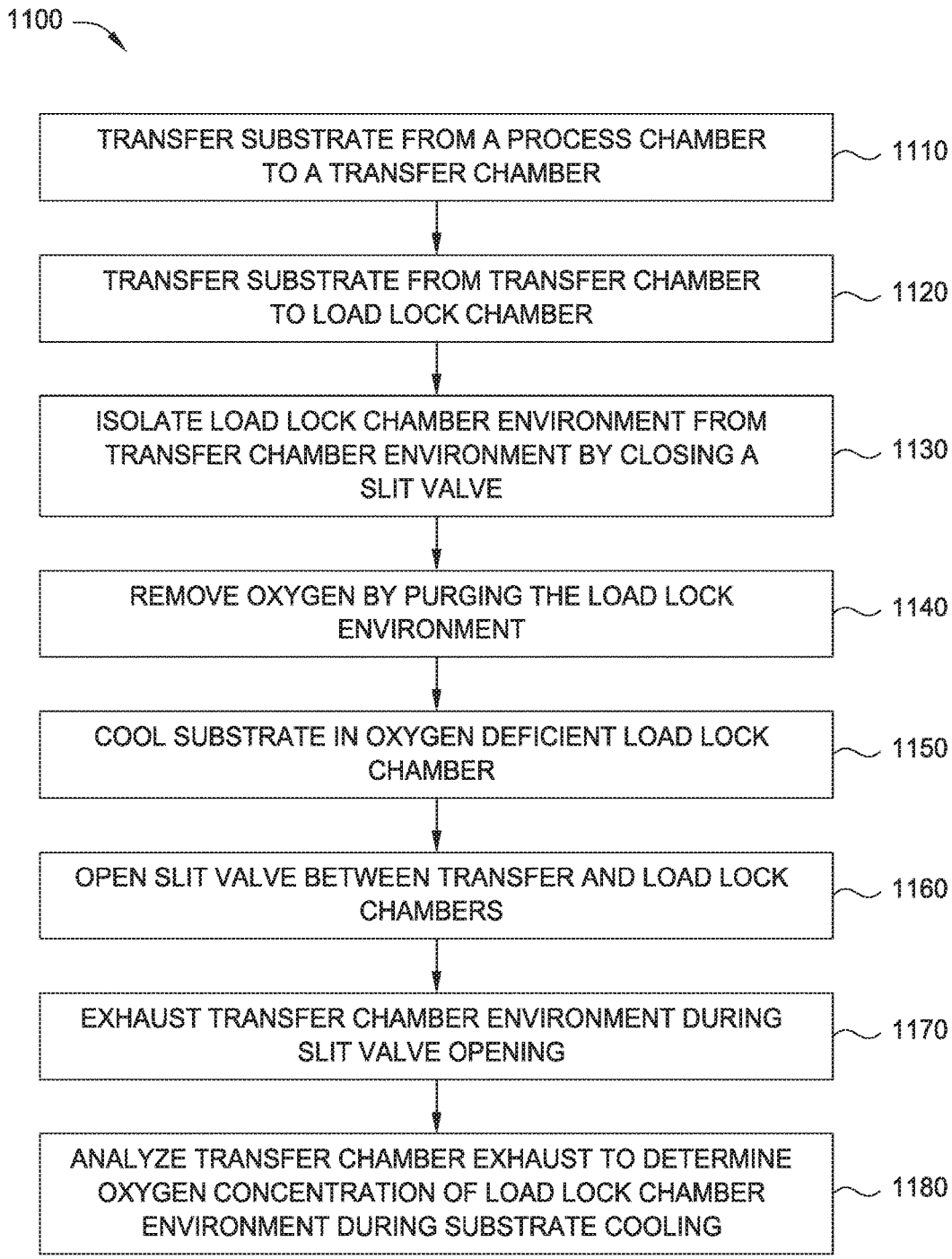
FIG. 11 illustrates operations of a method for transferring a substrate and measuring oxygen concentration in a load lock chamber according to implementations described herein.

FIG. 11 illustrates operations of a method 1100 for transferring a substrate and measuring oxygen concentration in a load lock chamber according to implementations described herein. At operation 1110, the substrate 230 is transferred from the process chamber 116 to the transfer chamber 114. At operation 1120, the substrate 230 is transferred to the load lock chamber 112.

At operation 1130, the load lock chamber environment is isolated from the transfer chamber environment by closing the second slit valve 518. Oxygen is removed from the load lock chamber 112 by purging the load lock environment at operation 1140. At operation 1150, the substrate 230 is cooled in an oxygen deficient, oxidant deficient, and/or substantially inert environment. By allowing the substrate to be transferred and cooled in a substantially inert and oxidant free environment, it is believed that subsequent contact structure formation processes may be improved.

At operation 1160, the second slit valve 518 is opened between the load lock chamber 112 and the transfer chamber 114. At operation 1170, the transfer chamber environment is exhausted during opening of the second slit valve 518. At operation 1180, the transfer chamber exhaust is analyzed to determine the oxygen concentration of the load lock chamber environment during substrate cooling. It is also contemplated that the internal volume 502 of the transfer chamber 114 may be analyzed for oxygen concentration utilizing the oxygen sensors.

Thus, it is possible to determine whether the substrate 230 has been cooled in a substantially inert environment. If the oxygen sensor 522 determines the oxygen concentration is too great, for example, above about 1 ppm, data can be generated indicating the substrate 230 was exposed to oxygen at which time the operator of the process system 100 can determine what remedial measures are to be implemented, if any.

FIG. 6A illustrates a schematic, partial perspective view of the load lock chamber of FIG. 5, with the lid 506 removed for clarity, according to implementations described herein. The chamber body 210 includes sidewalls 628 which at least partially surround the substrate support 508. The sidewalls 628 may be fabricated from the same materials utilized to form the chamber body 210 in one implementation. In another implementation, the sidewalls 628 may be a process kit which is detachable from the chamber body 210. Examples of suitable materials utilized to fabricate the sidewalls 628 include aluminum, stainless steel, and combinations thereof, or various ceramic materials in the case of a process kit.

An exhaust port 626 is formed in the sidewalls 628 and the exhaust port 626 is in fluid communication with the internal volume 502. The exhaust port 626 is also in fluid communication with a pump or exhaust (not shown). In operation, the load lock chamber 112 may be pumped down via the exhaust port 626 to a pressure of between about 2 Torr and about 5 Torr to remove all or substantially all of the oxygen that may be present in the internal volume 502. A purge gas, such as nitrogen or the like, is delivered to the internal volume 502 and the pressure is elevated to about atmospheric pressure or slightly above atmospheric pressure. In one implementation, the purge gas elevates a pressure within the internal volume 502 to between about 1 psi and about 10 psi above atmospheric pressure. It is believed that utilizing a slightly positive pressure reduces or eliminates the probability of oxygen entering the load lock chamber 112 during substrate cooling.

The load lock chamber 112 also includes a plurality of lift pins 602. The plurality of lift pins 602 are spaced about a circumference of the substrate support 508. In the illustrated implementation, three lift pins 602 are shown, however, it is contemplated that a greater number of lift pins may also be utilized. The substrate support 508 has recesses 604 formed therein which are sized to accommodate the lift pins 602, which extend laterally toward a center of the substrate support 508. The recesses 604 therefore extend radially from an edge of the substrate support toward the center thereof. Similar to the lift pins 602, the recesses 604 are spaced about the circumference of the substrate support 508. In one implementation, the recesses 604 and the lift pins 602 are disposed at corresponding locations about the circumference of the substrate support 508. In another implementation, the recesses 604 have a semi-circular shape, however it is contemplated that other shapes may be utilized to accommodate the lift pins 602.

In one implementation, the lift pins 602 and recesses 604 are disposed adjacent to the chamber body 210 on sides which are perpendicular to the sides having the slit valve doors 214, 216 coupled thereto. In one implementation, one of the lift pins 602 is disposed opposite the other two lift pins 602. The position of the lift pins 602 relative to the substrate support 508 and substrate transfer path enables the substrate 230 to be supported by the lift pins 602 and substrate support 508 without changing the transfer path of the substrate 230.

FIG. 6B illustrates a schematic, cross-sectional view of one of the lift pins 602 of the load lock chamber 112 of FIG. 6A according to implementations described herein. Each lift pin 602 includes a shaft 606, a first extension 608 coupled to and extending from the shaft 606, and a second extension 610 coupled to and extending from the shaft 606. At least one of the first extension 608 and the second extension 610 is attached to the shaft 606 at a location between a first end of the shaft 606 and a second end of the shaft 606. The first extension 608 may be attached between the first end and second end of the shaft 606, while the second extension 610 is attached at the second end of the shaft 606.

Each of the first and second extensions 608, 610 extends laterally from the shaft 606, for example at 90° angles. Each of the extensions 608, 610, may extend from the shaft 606 at 90° angles, or another angle that similarly enables supporting a substrate. For example, the second extension 610 may form a 90° angle with the shaft 606 while the first extension 608 extends laterally away from the shaft 606 and from the second extension 610. Additionally, each of the first and second extensions 608, 610 are shown as straight members extending linearly away from the shaft 606, but one or more of the extensions 608, 610 may be non-linear. For example, one or more of the first and second extensions 608, 610 may be angled members having a first portion forming an angle with the shaft 606 and a second portion forming an angle with the first portion.

The shaft 606 is disposed radially outward from an edge of the substrate support 508 and the first and second extensions 608, 610 extend radially inward from the shaft 606. In one implementation, the first and second extensions 608, 610 extend radially inward of the substrate support 508 outer edge.

The first extension 608 and second extension 610 are spaced apart by a distance 620 which is suitable to accommodate positioning and support of the substrate 230 on the first extension. In one implementation, the distance 620 is between about 10 millimeters (mm) and about 30 mm, such as about 20 mm. The first extension 608 includes a top surface 612 which has a first support ball 616 disposed therein. Similar to the first extension 608, the second extension 610 has a top surface 614 which has a second support ball 618 disposed therein. The first and second support balls 616, 618 are coupled to the top surfaces 612, 614, respectively, and extend above the top surfaces 612, 614. When the substrate 230 is supported by the lift pins 602, the substrate 230 contacts and rests on the support balls 616, 618. Examples of suitable materials for fabricating the support balls 616, 618 include various ceramic materials, such as silicon nitride or silicon carbide. While the support balls 616, 618 are described herein as being spherical in shape, it is contemplated that the support balls 616, 618 may be oval pads, rounded rectangles, protrusions from the top surfaces 612, 614, or the like.

Referring back to FIG. 6A, the substrate support 508 also includes a plurality of contact balls 622 which are disposed in a top surface of the substrate support 508. The contact balls 622 are spaced apart such that the substrate 230 is evenly supported during cooling processes in the load lock chamber 112. Similar to the support balls 616, 618, the contact balls 622 are fabricated from one or more ceramic materials such as silicon nitride or silicon carbide.

In operation, the lift pins 602 are elevated to a loading/unloading position where the first extension 608 is disposed above the top surface of the substrate support 508. A substrate which has not been processed is placed on the second extension 610 when the substrate is transferred from the factory interface 102. A substrate which has been processed by the process chamber 116 is placed on the first extension 608 by the robot 224 of the transfer chamber 114. The lift pins 602 are retracted from the loading/unloading position to a process position where the first extension 608 is disposed in the recess 604 and the substrate is supported by the contact balls 622 to cool the processed substrate.

After the processed substrate has been sufficiently cooled, the lift pins 602 are extended from the process position to the loading/unloading position during placement of the substrates on the lift pins 602. A robot from the factory interface 102 retrieves the processed substrate supported by the first extension 608. The unprocessed substrate supported by the second extension 610 is retrieved by the robot 224 and transferred through the transfer chamber 114 to the process chamber 116. Accordingly, the load lock chamber 112 provides for improved efficiency in transporting and cooling substrates in an environment with no or substantially no oxygen.

FIG. 6C illustrates a schematic, cross-sectional view of the substrate support 508 and contact balls 622 of FIG. 6A according to implementations described herein. The contact balls 622, which are coupled to the pedestal, such as by press fitting or the like, extend above the top surface of the substrate support 508 a distance 624. In one implementation, the distance 624 is between about 0.01 inches and about 0.03 inches. It is contemplated that the distance 624 may be modulated to influence the cooling rate of the substrate 230. For example, a smaller distance 624 may provide for a faster cooling rate of the substrate 230 while a greater distance 624 may provide for a slower cooling rate.

FIG. 7 illustrates a schematic, plan view of a process system 700 according to implementations described herein. The process system 700 includes a factory interface 702, a substrate transfer module 704, and a process module 706. The factory interface 702 includes a plurality of FOUPs 708 and an FI transfer chamber 710. The substrate transfer module 704 includes a plurality of load lock chambers 712 and a transfer chamber 714. The load lock chambers 712 are coupled to the FI transfer chamber 710 and the transfer chamber 714 is coupled to the load lock chambers 712. In one implementation, the transfer chamber 714 is a single chamber 716 having a plurality, such as two, transfer robots disposed therein. In one implementation, the load lock chambers 712 and transfer chamber 714 are similar to the load lock chamber 112 and transfer chamber 114, respectively.

The process module 706 includes a plurality of process chambers 718, such as thermal processing chambers. In one implementation, the process chambers 718 are rapid thermal process chambers, such as laser thermal process chambers. In other implementations, the process chambers 718 may be deposition chambers, etch chambers, cleaning chambers, and the like depending upon the desired implementation. By utilizing a transfer chamber 714 having a single chamber 716, substrates may be transferred between the robots in the transfer chamber 714 to improve substrate transfer efficiency.

FIG. 8 illustrates a schematic, plan view of a process system 800 according to implementations described herein. The process system 800 includes a factory interface 802, a substrate transfer module 804, and a process module 806. The factory interface 802 includes a plurality of FOUPs 808 and an FI transfer chamber 810. The substrate transfer module 804 includes a load lock chamber 812 and a plurality of transfer chambers 814. In one implementation, the load lock chamber 812 and the plurality of transfer chambers 814 are similar to the load lock chamber 112 and the transfer chamber 114, respectively.

The load lock chamber 812 is disposed between the transfer chambers 814 and the robots in each of the transfer chambers 814 can access the load lock chamber 812. The load lock chamber 812 is coupled to the factory interface 802 and receives substrates from the FI transfer chamber 810. The transfer chambers 814 retrieve substrates from the centrally disposed load lock chamber 812 and transfer the substrates to the process module 806.

Similar to the process module 706, the process module 806 includes a plurality of process chambers 818, such as thermal processing chambers. In one implementation, the process chambers 818 are rapid thermal process chambers, such as laser thermal process chambers. In other implementations, the process chambers 818 may be deposition chambers, etch chambers, cleaning chamber, and the like depending upon the desired implementation.

Figure 9:
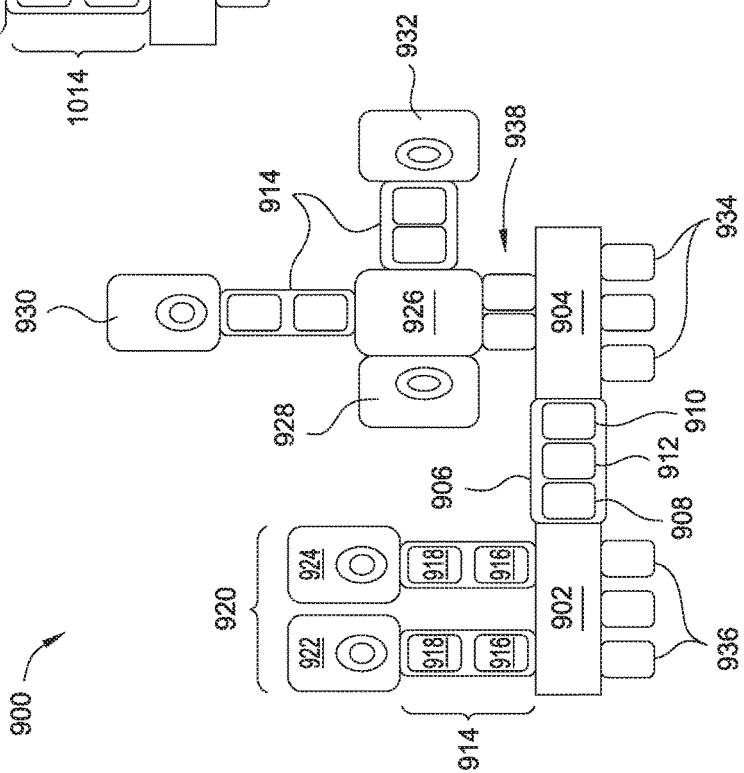
FIG. 9 illustrates a schematic view of a process platform according to implementations described herein.

FIG. 9 illustrates a schematic view of a process platform 900 according to implementations described herein. The platform 900 is contemplated to be modular in nature a capable of being re-arranged to best suit process capabilities. It is also contemplated that various chambers and components may be removed from or added to the platform 900 to enable a wide range of application specific processes on a single platform.

The platform 900 includes a first factory interface 902 which has a plurality of FOUPs 936 coupled thereto. A plurality of substrate transfer modules 914 are coupled to the first factory interface 902. The substrate transfer modules 914 include a load lock chamber 916 and a transfer chamber 918. In one implementation, the load lock chamber 916 is similar to the load lock chamber 112. In another implementation, the transfer chamber 918 is similar to the transfer chamber 114. The platform 900 also includes a process module 920. The process module 920 includes a first process chamber 922 and a second process chamber 924. In one implementation, the first process camber 922 and the second process chamber 924 are similar to the process chambers 116.

The platform 900 further includes a second factory interface 904 which has a plurality of FOUPs 934 coupled thereto. A central transfer chamber 926 is coupled to the second factory interface 904 by a plurality of load lock chambers 938. A plurality of process chambers 928, 930, 932 are coupled to and disposed about the central transfer chamber 926. In one implementation, the process chamber 928 is coupled directly to the central transfer chamber 926. Process chambers 930 and 932 are coupled to the central transfer chamber by individual substrate transfer modules 914.

The arrangement of process chambers relative to transfer chambers and factory interfaces may be improved by the utilization of the substrate transfer module 914. Improved substrate environment management and efficient substrate transfer may be achieved by utilizing the substrate transfer module 914 to facilitate improved platform flexibility.

The platform 900 also includes a tunnel chamber 906. The tunnel chamber 906 is disposed between the first factory interface 902 and the second factory interface 904. The tunnel chamber 906 includes a first load lock chamber 908, a transfer chamber 912, and a second load lock chamber 910. The first load lock chamber 908 is disposed between the first factory interface 902 and the transfer chamber 912 of the tunnel chamber 906. In one implementation, the load lock chambers 908, 910 are similar to the load lock chambers 112. Similarly, the transfer chamber 912 is similar to the transfer chamber 114. The second load lock chamber 910 is disposed between the second factory interface 904 and the transfer chamber 912 of the tunnel chamber 906. Thus, the tunnel chamber 906 enables substrate transfer between the first factory interface 902 and the second factory interface 904.

By coupling the factory interfaces 902, 904 with the tunnel chamber 906, substrates need not return to the FOUPS 936 after processing in the process module 920. Rather, substrate may be transferred through the tunnel chamber 906 to one or more of the process chambers 928, 930, 932 for subsequent processing operations. In one example, the process chambers 928, 930, 932 may be any of a deposition chamber, an etch chamber, a cleaning chamber, or other chamber type having various other process capabilities. Accordingly, subsequent processing operations may be performed on a thermally processed substrate without exposing the substrate to oxygen during transfer between multiple platforms.

Figure 10:
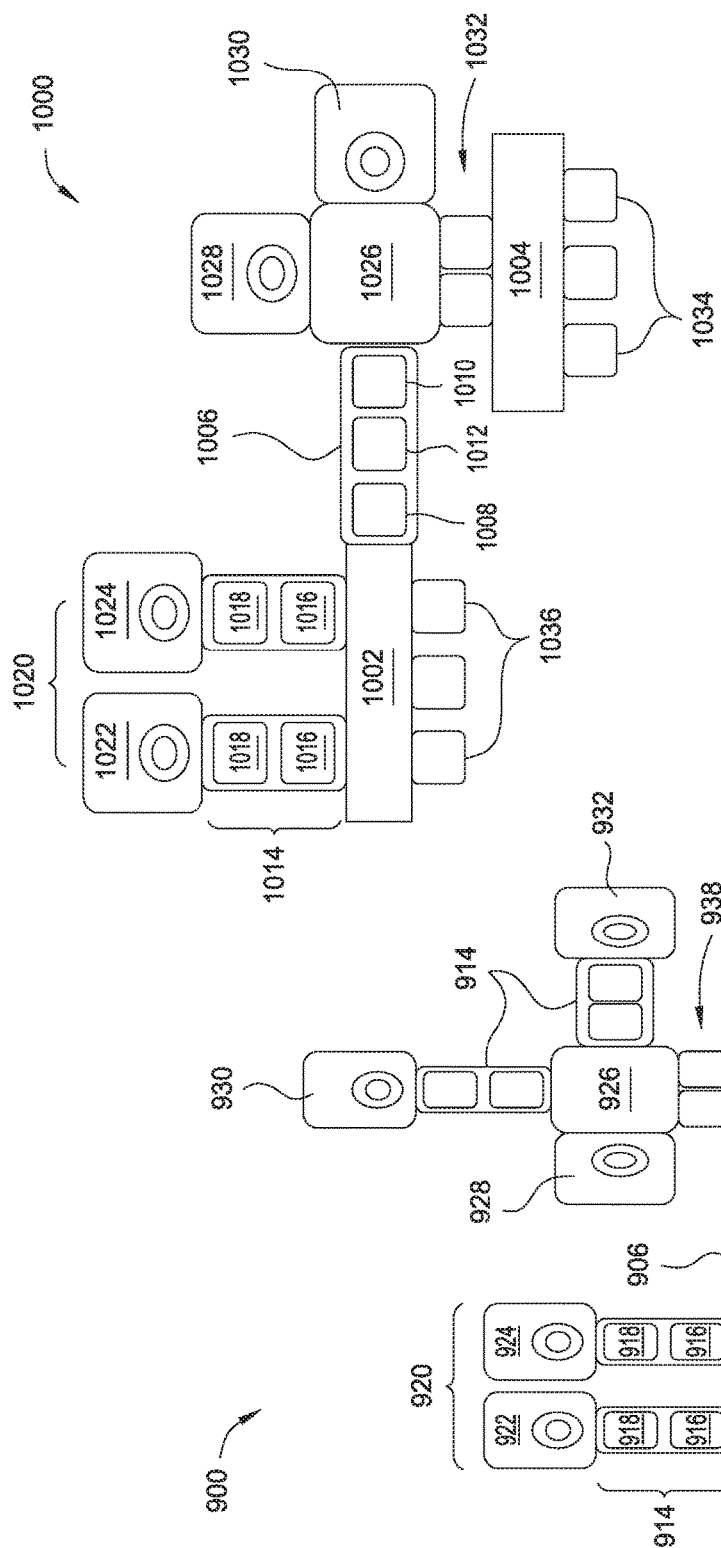
FIG. 10 illustrates a schematic view of a process platform according to implementations described herein.

FIG. 10 illustrates a schematic view of a process platform 1000 according to implementations described herein. The platform 1000 is contemplated to be modular in nature and capable of being re-arranged to best suit process capabilities. It is also contemplated that various chambers and components may be removed from or added to the platform 1000 to enable a wide range of application specific processes on a single platform.

The platform 1000 includes a first factory interface 1002 which has a plurality of FOUPs 1036 coupled thereto. A plurality of substrate transfer modules 1014 are coupled to the first factory interface 1002. The substrate transfer modules 1014 include a load lock chamber 1016 and a transfer chamber 1018. In one implementation, the load lock chamber 1016 is similar to the load lock chamber 112. In another implementation, the transfer chamber 1018 is similar to the transfer chamber 114. The platform 1000 also includes a process module 1020. The process module 1020 includes a first process chamber 1022 and a second process chamber 1024. In one implementation, the first process camber 1022 and the second process chamber 1024 are similar to the process chambers 116.

The platform 1000 further includes a second factory interface 904 which has a plurality of FOUPs 1034 coupled thereto. A central transfer chamber 1026 is coupled to the second factory interface 1004 by a plurality of load lock chambers 1032. A plurality of process chambers 1028, 1030 are coupled to and disposed about the central transfer chamber 1026. In one implementation, the process chamber 1028 and the process chamber 1030 are coupled directly to the central transfer chamber 1026.

The platform 1000 also includes a tunnel chamber 1006. The tunnel chamber 1006 is disposed between the first factory interface 902 and the central transfer chamber 1026. The tunnel chamber 1006 includes a first load lock chamber 1008, a transfer chamber 1012, and a second load lock chamber 1010. The first load lock chamber 1008 is disposed between the first factory interface 1002 and the transfer chamber 1012 of the tunnel chamber 1006. In one implementation, the load lock chambers 1008, 1010 are similar to the load lock chambers 112. Similarly, the transfer chamber 1012 is similar to the transfer chamber 114.

The second load lock chamber 1010 is disposed between the central transfer chamber 1026 and the transfer chamber 1012 of the tunnel chamber 1006. Thus, the tunnel chamber 1006 enables substrate transfer between the first factory interface 902 and the central transfer chamber 1026. Utilizing the arrangement of the platform 1000, efficiencies similar to those achieved with the platform 900 may also be achieved.

In one implementation, a substrate processing apparatus includes a factory interface, a substrate transfer module for generating a substantially inert environment at about atmospheric pressure. The substrate transfer module includes a load lock chamber coupled to the factory interface, the load lock chamber having a chamber body defining a process volume and a purge gas port in fluid communication with the process volume and a transfer chamber coupled to the load lock chamber. A process module is also coupled to the substrate transfer module, wherein the process module comprises a plurality of process chamber.

In one implementation, the factory interface further comprises a plurality of front opening unified pods coupled to the factory interface.

In one implementation, the substrate transfer module comprises a pair of load lock chambers.

In one implementation, the substrate transfer module comprises a pair of transfer chambers.

In one implementation, the load lock chamber comprises an exhaust port in fluid communication with the process volume.

In one implementation, the load lock chamber comprises a pedestal disposed in the process volume, wherein the pedestal has a plurality of cooling fluid conduits formed therein.

In one implementation, the load lock chamber has a first slit valve formed in the chamber body adjacent to the factory interface and a first slit valve door coupled to the chamber adjacent to the first slit valve.

In one implementation, the load lock chamber has a second slit valve formed in the chamber adjacent to the transfer chamber and a second slit valve door coupled to the chamber adjacent to the second slit valve.

In one implementation, each of the process chambers is a rapid thermal process chamber.

In one implementation, each of the rapid thermal process chambers is a laser thermal process chamber.

In one implementation, each of the laser thermal process chambers is operated at about atmospheric pressure.

In one implementation, a substrate processing apparatus includes a factory interface and the factory interface comprises a first transfer chamber having a first robot disposed therein. The apparatus also includes a substrate transfer module for generating a substantially inert environment at about atmospheric pressure. The substrate transfer module comprises a load lock chamber coupled to the first transfer chamber and a second transfer chamber having a second robot disposed therein, wherein second transfer chamber is coupled to the load lock chamber. The apparatus also includes a process module coupled to the substrate transfer module, wherein the process module comprises a process chamber and the process chamber is coupled to the second transfer chamber.

In one implementation, the process chamber is a laser thermal process chamber.

In one implementation, the process chamber is a deposition chamber.

In one implementation, the process chamber is an etch chamber.

In one implementation, the load lock chamber comprises a chamber body defining a process volume, a purge gas port in fluid communication with the process volume, and an exhaust port in fluid communication with the process volume.

In one implementation, the load lock chamber comprises a pedestal disposed in the process volume and the pedestal has a plurality of cooling fluid conduits formed therein.

In one implementation, a substrate processing apparatus includes a factory interface and the factory interface includes a first transfer chamber having a first robot disposed therein and a plurality of front opening unified pods coupled to the first transfer chamber. The apparatus also includes a substrate transfer module for generating a substantially inert environment at about atmospheric pressure. The substrate transfer module includes an atmospheric load lock chamber coupled to the first transfer chamber and a second transfer chamber having a second robot disposed therein, wherein the second transfer chamber is coupled to the load lock chamber. The apparatus also includes a process module coupled to the substrate transfer module, wherein the process module comprises a laser thermal process chamber and the laser thermal process chamber is coupled to the second transfer chamber.

In one implementation, the second transfer chamber comprises a chamber body, an exhaust port disposed in the chamber body, and an exhaust conduit coupled to the chamber body extending from the exhaust port.

In one implementation, an oxygen sensor is in fluid communication with the exhaust conduit.

In one implementation, a substrate transfer apparatus comprises a load lock chamber for generating a substantially inert environment at about atmospheric pressure. The load lock chamber comprises a chamber body defining a process volume, a pedestal disposed in the process volume, a lid coupled to the chamber body opposite the pedestal, a purge gas port disposed through the lid, and an exhaust port disposed in the chamber body adjacent to the pedestal and opposite the purge gas port. The apparatus also includes a transfer chamber for generating a substantially inert environment at about atmospheric pressure coupled to the load lock chamber. The transfer chamber comprises a chamber body defining a transfer volume, a robot disposed in the transfer volume, a plurality of purge gas ports disposed in the chamber body, and an exhaust port disposed in the chamber body opposite the plurality of purge gas ports.

In one implementation, the load lock chamber further comprises a first slit valve formed in the load lock chamber body and a second slit valve formed in the load lock chamber body opposite the first slit valve.

In one implementation, the load lock chamber further comprises a first slit valve door coupled to the load lock chamber body adjacent to the first slit valve and a second slit valve door coupled to the load lock chamber body adjacent to the second slit valve.

In one implementation, the load lock chamber further comprises a plurality of lift pins disposed about the pedestal, wherein a plurality of recesses are formed in the pedestal adjacent to the lift pins.

In one implementation, the each of the plurality of lift pins comprises a shaft, a first extension coupled to and extending from the shaft, a second extension coupled to and extending from the shaft, wherein the second extension is disposed adjacent to and spaced apart from the first extension.

In one implementation, the first extension and the second extension are spaced apart a distance of between about 10 mm and about 30 mm.

In one implementation, support balls are coupled to each of the first extension and the second extension.

In one implementation, the support balls are manufactured from a silicon nitride material.

In one implementation, the pedestal has a plurality of fluid conduits formed therein.

In one implementation, a top surface of the pedestal has a plurality of silicon nitride material contact balls disposed therein.

In one implementation, the transfer chamber body comprises an optically transparent lid coupled to the chamber body.

In one implementation, the optically transparent lid is manufactured from a polycarbonate material.

In one implementation, each of the plurality of purge gas ports has a diffuser extending therefrom.

In one implementation, the transfer chamber exhaust port is disposed in the transfer chamber body adjacent to a region where the load lock chamber is coupled to the transfer chamber.

In one implementation, a substrate processing apparatus comprises a load lock chamber for generating a substantially inert environment at about atmospheric pressure. The load lock chamber comprises a chamber body defining a process volume a pedestal disposed in the process volume, a fluid conduit disposed within the pedestal, a plurality of recesses formed along a circumference of the pedestal, and a plurality of lift pins disposed in the process volume, each lift pin disposed adjacent to one or more of the plurality of recesses. The apparatus also includes a lid coupled to the chamber body opposite the pedestal, a diffuser plate coupled to the lid at a center region of the lid, wherein a portion of a bottom surface of the lid is tapered extending radially outward from the diffuser plate, a purge gas port disposed through the diffuser plate, and an exhaust port disposed in the chamber body adjacent to the pedestal and opposite the purge gas port.

In one implementation, the chamber body is manufactured from aluminum billet.

In one implementation, the apparatus further comprises a first slit valve disposed in a sidewall of the chamber body, a first slit valve door coupled to the chamber body adjacent to the first slit valve, a second slit valve disposed in a sidewall of the chamber body opposite the first slit valve, and a second slit valve door coupled to the chamber body adjacent to the second slit valve.

In one implementation, a substrate transfer apparatus comprises a transfer chamber for generating a substantially inert environment at about atmospheric pressure coupled to the load lock chamber. The transfer chamber comprises a chamber body defining a transfer volume, an optically transparent lid coupled to the chamber body, and a robot disposed in the transfer volume, wherein a blade of the robot is manufactured from quartz. The apparatus also includes a plurality of purge gas ports disposed in the chamber body, a plurality of diffusers extending from the purge gas ports, an exhaust port disposed in the chamber body opposite the plurality of purge gas ports, an exhaust conduit coupled to the exhaust port, and an oxygen sensor in fluid communication with the transfer volume via the exhaust conduit and the exhaust port.

In one implementation, the oxygen sensor has an oxygen concentration sensitivity of less than about 1 part per million oxygen.

In one implementation, the oxygen sensor is coupled to the exhaust conduit via a first conduit and a second conduit.

In one implementation, a platform apparatus comprises a first factory interface, a second factory interface coupled to the first factory interface, and a tunnel chamber disposed between the first factory interface and the second factory interface, wherein the tunnel chamber comprises a transfer chamber and a plurality of load lock chamber. The apparatus also includes a first transfer module coupled to the first factory interface, a process module coupled to the first transfer module, a central transfer chamber coupled to the second factory interface, and a plurality of process chambers coupled to the central transfer chamber, wherein at least one of the plurality of process chambers is coupled to the central transfer chamber by a second transfer module.

In one implementation, the first and second transfer modules comprise a load lock chamber and a transfer chamber.

In one implementation, the load lock chamber and the transfer chamber generate a substantially inert environment at about atmospheric pressure.

In one implementation, the load lock chamber is coupled between the first factory interface and the transfer chamber.

In one implementation, the transfer chamber is coupled between the load lock chamber and the process module.

In one implementation, the process module comprises a laser thermal process chamber.

In one implementation, the process module comprises a lamp based thermal process chamber.

In one implementation, a first process chamber of the plurality of process chambers comprises a deposition chamber.

In one implementation, a second process chamber of the plurality of process chambers comprises an etch chamber.

In one implementation, a third process chamber of the plurality of process chamber comprises a cleaning chamber.

In one implementation, a platform apparatus comprises a first factory interface, a transfer module coupled to the first factory interface, a process module coupled to the transfer module, a second factory interface, and a central transfer chamber coupled to the second factory interface. The apparatus also includes a tunnel chamber disposed between the first factory interface and the central transfer chamber, wherein the tunnel chamber comprises a transfer chamber and a plurality of load lock chambers. The apparatus also includes a plurality of process chamber coupled to the central transfer chamber.

In one implementation, the transfer module comprises a load lock chamber and a transfer chamber.

In one implementation, the transfer module generates a substantially inert environment at about atmospheric pressure.

In one implementation, the load lock chamber is coupled between the first factory interface and the transfer chamber.

In one implementation, the transfer chamber is coupled between the load lock chamber and the process module.

In one implementation, the process module comprises a laser thermal process chamber.

In one implementation, the process module comprises a lamp based thermal process chamber.

In one implementation, a first process chamber of the plurality of process chambers is a deposition chamber.

In one implementation, a second process chamber of the plurality of process chambers is an etch chamber.

In one implementation, the tunnel chamber transfer chamber is disposed between the plurality of tunnel chambers and load lock chambers.

In one implementation, a substrate process method comprises transferring a substrate from a first chamber to a second chamber, isolating an environment of the second chamber from an environment of the first chamber, removing oxygen from the environment of the second chamber, and cooling the substrate in the second chamber. The method also includes opening a slit valve between the first chamber and the second chamber, evacuating the environment of the first chamber, and analyzing the first chamber exhaust to determine an oxygen concentration of the environment of the second chamber.

In one implementation, the environment of the first chamber is maintained at about atmospheric pressure during transfer of the substrate.

In one implementation, the environment of the second chamber is maintained at about atmospheric pressure during transfer of the substrate.

In one implementation, the environment of the first chamber is maintained under vacuum during transfer of the substrate.

In one implementation, the environment of the second chamber is maintained under vacuum during transfer of the substrate.

In one implementation, the removing oxygen from the environment of the second chamber comprises purging the environment of the second chamber with an inert gas.

In one implementation, the inert gas is nitrogen.

In one implementation, the environment of the second chamber is maintained at above atmospheric pressure during cooling of the substrate.

In one implementation, a pressure of the environment of the second chamber during the cooling of the substrate is between about 1 psi and about 10 psi above atmospheric pressure.

In one implementation, a substrate process method comprises transferring a substrate from a transfer chamber to a load lock chamber, closing a slit valve between the transfer chamber and the load lock chamber to isolate an environment of the load lock chamber from an environment of the transfer chamber, removing oxygen from the environment of the load lock chamber, and cooling the substrate in the load lock chamber. The method also includes opening the slit valve between the transfer chamber and the load lock chamber, evacuating the environment of the transfer chamber, evacuating the environment of the transfer chamber during opening of the slit valve, and analyzing the transfer chamber exhaust to determine an oxygen concentration of the environment of the load lock chamber during the cooling of the substrate.

In one implementation, the environment of the transfer chamber is maintained at about atmospheric pressure during transfer of the substrate.

In one implementation, the environment of the load lock chamber is maintained at about atmospheric pressure during transfer of the substrate.

In one implementation, the environment of the transfer chamber is maintained under vacuum during transfer of the substrate.

In one implementation, the environment of the load lock chamber is maintained under vacuum during transfer of the substrate.

In one implementation, the removing oxygen from the environment of the load lock chamber comprises purging the environment of the load lock chamber with nitrogen gas.

In one implementation, a pressure of the environment of the load lock chamber during the cooling of the substrate and the purging is between about 1 psi and about 10 psi above atmospheric pressure.

In one implementation, an oxygen concentration in the environment of the load lock chamber during the cooling of the substrate is less than about 1 ppm.

In one implementation, a substrate transfer method comprises transferring a substrate from a process chamber to a transfer chamber, transferring the substrate from the transfer chamber to a load lock chamber, and closing a slit valve between the transfer chamber and the load lock chamber to isolate an environment of the load lock chamber from an environment of the transfer chamber. The method also includes removing oxygen from the environment of the load lock chamber, cooling the substrate in the load lock chamber, opening the slit valve between the transfer chamber and the load lock chamber, evacuating the environment of the transfer chamber during opening of the slit valve, and analyzing the transfer chamber exhaust to determine an oxygen concentration of the environment of the load lock chamber during cooling of the substrate.

In one implementation, the process chamber is a laser thermal process chamber

In one implementation, environments of each of the process chamber, the transfer chamber, and the load lock chamber are maintained at about atmospheric pressure during transfer of the substrate.

While the foregoing is directed to implementations of the present disclosure, other and further implementations of the disclosure may be devised without departing from the basic scope thereof, and the scope thereof is determined by the claims that follow.

What is claimed is:

1. A substrate processing apparatus, comprising:
  a factory interface;
  a substrate transfer module, comprising:
    a load lock chamber coupled to the factory interface, wherein the load lock chamber comprises:
      a chamber body defining a process volume;
      an exhaust port and a purge gas port in fluid communication with the process volume; and
      a pedestal disposed in the process volume, wherein the pedestal has a plurality of cooling fluid conduits formed therein;
    a transfer chamber directly coupled to the load lock chamber, the transfer chamber having a chamber body defining a transfer volume and an oxygen sensor in fluid communication with the transfer volume, the transfer chamber and the load lock chamber configured to generate a substantially inert environment at about atmospheric pressure; and a process module coupled to the substrate transfer module, wherein the process module comprises a plurality of process chambers.

2. The apparatus of claim 1, wherein the factory interface further comprises:
a plurality of front opening unified pods coupled to the factory interface.

3. The apparatus of claim 1, wherein the substrate transfer module further comprises a second load lock chamber.

4. The apparatus of claim 1, wherein the substrate transfer module further comprises a second transfer chamber.

5. The apparatus of claim 1, wherein the load lock chamber has a first slit valve formed in the chamber body adjacent to the factory interface and a first slit valve door coupled to the chamber body adjacent to the first slit valve.

6. The apparatus of claim 5, wherein the load lock chamber has a second slit valve formed in the chamber body adjacent to the transfer chamber and a second slit valve door coupled to the chamber body adjacent to the second slit valve.

7. The apparatus of claim 6, wherein a second transfer chamber comprises:
a chamber body;
an exhaust port disposed in the chamber body; and
an exhaust conduit coupled to the chamber body and extending from the exhaust port.

8. A substrate processing apparatus, comprising:
a factory interface;
a substrate transfer module, comprising:
a load lock chamber coupled to the factory interface, the load lock chamber having a chamber body defining a process volume and a purge gas port in fluid communication with the process volume; and
a transfer chamber directly coupled to the load lock chamber, the transfer chamber having a chamber body defining a transfer volume and an oxygen sensor in fluid communication with the transfer volume, the transfer chamber and the load lock chamber configured to generate a substantially inert environment at about atmospheric pressure; and
a process module coupled to the substrate transfer module, wherein the process module comprises a plurality of process chambers, wherein each of the process chambers is a rapid thermal process chamber.

9. The apparatus of claim 8, wherein each of the rapid thermal process chambers is a laser thermal process chamber.

10. The apparatus of claim 9, wherein each of the laser thermal process chambers is operated at about atmospheric pressure.

11. A substrate processing apparatus, comprising:
a factory interface, wherein the factory interface comprises:
a first transfer chamber having a first robot disposed therein;
a substrate transfer module comprising:
a load lock chamber coupled to the first transfer chamber; and
a second transfer chamber having a second robot disposed therein, the second transfer chamber directly coupled to the load lock chamber, the second transfer chamber having a chamber body defining a transfer volume and an oxygen sensor in fluid communication with the transfer volume, the second transfer chamber and the load lock chamber configured to generate a substantially inert environment at about atmospheric pressure; and
a process module coupled to the substrate transfer module, wherein the process module comprises a process chamber, wherein the process chamber is coupled to the second transfer chamber, and wherein the process chamber is selected from the group consisting of a laser thermal process chamber, a deposition chamber, and an etch chamber.

12. The apparatus of claim 11, wherein the load lock chamber comprises:
a chamber body defining a process volume;
a purge gas port in fluid communication with the process volume; and
an exhaust port in fluid communication with the process volume.

13. A substrate processing apparatus, comprising:
a factory interface, wherein the factory interface comprises:
a first transfer chamber having a first robot disposed therein;
a substrate transfer module comprising:
a load lock chamber coupled to the first transfer chamber, wherein the load lock chamber comprises:
a chamber body defining a process volume;
a purge gas port in fluid communication with the process volume;
an exhaust port in fluid communication with the process volume; and
a pedestal disposed in the process volume, wherein the pedestal has a plurality of cooling fluid conduits formed therein;
a second transfer chamber having a second robot disposed therein, the second transfer chamber directly coupled to the load lock chamber, the second transfer chamber having a chamber body defining a transfer volume and an oxygen sensor in fluid communication with the transfer volume, the second transfer chamber and the load lock chamber configured to generate a substantially inert environment at about atmospheric pressure; and
a process module coupled to the substrate transfer module, wherein the process module comprises a process chamber, wherein the process chamber is coupled to the second transfer chamber.

* * * * *